(12) United States Patent
Veitschegger et al.

(10) Patent No.: US 6,818,477 B2
(45) Date of Patent: Nov. 16, 2004

(54) METHOD OF MOUNTING A COMPONENT IN AN EDGE-PLATED HOLE FORMED IN A PRINTED CIRCUIT BOARD

(75) Inventors: William K. Veitschegger, Folsom, CA (US); Scott Sauer, Rocklin, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 10/217,726

(22) Filed: Aug. 13, 2002

(65) Prior Publication Data
US 2003/0100197 A1 May 29, 2003

Related U.S. Application Data
(60) Provisional application No. 60/333,643, filed on Nov. 26, 2001.

(51) Int. Cl.[7] ............................. H01L 21/58; H05K 3/34
(52) U.S. Cl. ......................... 438/122; 29/832; 29/847; 361/761
(58) Field of Search ................................. 438/118, 122, 438/612; 29/832, 834, 846, 847; 361/761; 174/265

(56) References Cited

U.S. PATENT DOCUMENTS

| | | |
|---|---|---|
| 3,611,059 A | 10/1971 | Carley |
| 4,450,471 A | 5/1984 | Wellhoefer et al. |
| 4,639,760 A | 1/1987 | Granberg et al. |
| 4,965,227 A * | 10/1990 | Chang et al. .................. 29/827 |
| 4,999,740 A * | 3/1991 | Ilardi et al. .................. 361/720 |
| 5,075,759 A | 12/1991 | Moline |
| 5,105,260 A | 4/1992 | Butera |
| 5,109,268 A | 4/1992 | Butera |
| 5,221,399 A * | 6/1993 | Sanborn et al. ............. 156/285 |
| 5,229,327 A | 7/1993 | Farnworth |
| 5,287,247 A * | 2/1994 | Smits et al. ................. 361/707 |
| 5,446,959 A | 9/1995 | Kim et al. |
| 5,612,853 A | 3/1997 | Kim et al. |
| 5,760,473 A | 6/1998 | Dickson et al. |
| 5,783,466 A | 7/1998 | Takahashi et al. |
| 5,804,873 A | 9/1998 | Pelly |
| 5,814,880 A | 9/1998 | Costello et al. |
| 5,846,852 A | 12/1998 | Limper-Brenner et al. |
| 5,872,396 A | 2/1999 | Kosaki |
| 5,892,279 A | 4/1999 | Nguyen |
| 5,943,216 A * | 8/1999 | Schmidt ...................... 361/761 |
| 5,973,923 A | 10/1999 | Jitaru |
| 6,093,960 A | 7/2000 | Tao et al. |
| 6,188,579 B1 * | 2/2001 | Buondelmonte et al. .... 361/719 |
| 6,276,593 B1 * | 8/2001 | Artaki et al. .......... 228/180.21 |
| 6,421,253 B1 * | 7/2002 | Ash, Jr. ...................... 361/808 |
| 6,681,483 B2 * | 1/2004 | Crescenzi et al. ............. 29/852 |
| 2002/0054480 A1 * | 5/2002 | Jitaru ........................ 361/704 |

* cited by examiner

Primary Examiner—Carl Whitehead, Jr.
Assistant Examiner—Stephen W. Smoot
(74) Attorney, Agent, or Firm—Paul B. Heynssens; Peter J. Meza; Hogan & Hartson LLP

(57) ABSTRACT

A printed circuit board (PCB) assembly comprising a PCB having a top circuitry layer and a bottom layer with a hole through the PCB, a component, and a pallet. The printed circuit board manufactured by a method including forming a hole through the top circuitry layer and the bottom layer, attaching the bottom layer to a pallet, placing the component in the hole, and soldering the component to the top circuitry layer and to the pallet.

37 Claims, 19 Drawing Sheets

METHOD OF MOUNTING A COMPONENT IN AN EDGE-PLATED HOLE FORMED IN A PRINTED CIRCUIT BOARD

CROSS REFERENCE TO RELATED APPLICATION

This application claim benefit of U.S. Provisional Patent Application No. 60/333,643 filed Nov. 26, 2001, the contents of which we hereby incorporated by reference.

BACKGROUND

This application relates generally to the field of electrical circuits and in particular to the manufacture of multi-layer printed circuit boards.

Some components, typically high power components, are unsuitable to be incorporated in a multi-layer printed circuit board or mounted on the surface of a multi-layer printed circuit board with conventional automated assembly techniques. Typically, components having large heat sinks and/or utilizing attachment to an external heat sink or heat spreader, such as power transistor, and other flanged parts are especially problematic to automated assembly technique, such as pick and place. Typical problem components may include, but are not limited to, high-power transistors as used in a power supply, and high-power transistors and high-power attenuators typically used in radio frequency (RF) or microwave circuits. The heat sinks of these parts often serve as circuit ground connections.

A typical method of mounting high power components is to cut a hole large enough to clear the component through the multi-layer printed circuit board and then attach the component to an external heat sink. For example, if the component is a flanged high-power radio frequency ("RF") transistor, the hole is made large enough for the flange to pass through. A thermal and electrical connection is then typically formed between the flange and a heat sink, typically by using mounting hardware, or solder. Heat sinks are typically constructed as a pallet formed of a metal such as copper or aluminum that possesses good thermal conductivity.

As will be appreciated by those skilled in the art, it is difficult to satisfactorily solder a flanged part to a large mass of metal, such as a heat sink. With the increased use of high thermal conductivity heat sinks such as copper coated graphite composites, the problem becomes more acute. Mechanical attachment with thermal grease, screws and the like is an alternative method of attachment that is usually undesirable due to the additional manufacturing steps and additional hardware required.

In the construction of radio frequency (RF), and microwave circuits, a low-impedance connection is often desirable between a bottom side ground layer of a multi-layer printed circuit board (multi-layer PCB), the flanged part, and the pallet especially at the edges of a clearance hole made in the multi-layer PCB. A good connection at the edges of the hole is desirable because an RF return current travels by transitions from the PCB to the flange of the transistor through the heat sink. This connection is typically made by assembling the multi-layer PCB to a copper or aluminum pallet using screws or a conductive medium such as solder or conductive epoxy. The flanged part is similarly attached to the heat sink. Thus, and the heat sink serves to couple the PCB electrical ground to the ground of the flanged part.

All of the foregoing methods have associated manufacturing difficulties, poor electrical performance, and correspondingly high manufacturing costs. Accordingly, there is a need for a lower-cost method of assembling multi-layer PCBs having components heat sinks, or pallets, and components (such as flanged RF power transistor) mounted to the board, and to the pallet that preserve a low impedance electrical ground connection to and from the component.

SUMMARY OF THE INVENTION

According to one aspect of the invention a method of mounting a flanged component to a printed wiring board that has been bonded to a pallet, is provided. The method of mounting tends to provide RF grounding of the flanged component to the pallet, and from ground circuitry on the printed wiring board to the pallet. The pallet is typically a metal heat sink, such as a copper block. The steps of the method of mounting comprise fabricating a printed wiring board having a clearance hole cut through it to accommodate the flange mounted component. The walls of the clearance hole are plated with a conductor. The plating around the top of the hole is removed, such that the plating remaining on the walls is coupled to an electrical ground connection available from the printed wiring board. The bottom of the printed wiring board is glued or bonded to the metal pallet. Solder, and then the flanged component are disposed in the hole. The solder is melted, flowing to the walls and onto the pallet. The solder connection formed electrically couples the printed wiring board ground to the flange and the pallet.

According to another aspect of the invention a method of mounting a flanged component to a printed wiring board that has been bonded to a pallet, is provided. The method of mounting tends to provide RF grounding of the flanged component to the pallet, and from ground circuitry on the printed wiring board to the pallet. The pallet is typically a metal heat sink, such as a copper block. The steps of the method of mounting comprise fabricating a printed wiring board having a well disposed in it of a size sufficient to accommodate the flange mounted component. The well is plated with a conductor, such that metal is disposed upon the walls of the well. A hole is made such that the bottom of the well is substantially removed. A hole in the printed wiring board is thus formed in which the plating around the top of the hole is removed, such that the plating remaining on the walls is coupled to an electrical ground connection available from the printed wiring board. The bottom of the printed wiring board is glued or bonded to the metal pallet. Solder, and then the flanged component are disposed in the hole. The solder is melted, flowing to the walls and onto the pallet. The solder connection formed electrically couples the printed wiring board ground to the flange and the pallet.

DESCRIPTION OF THE DRAWINGS

First Embodiment

Second Embodiment

Figure 7:
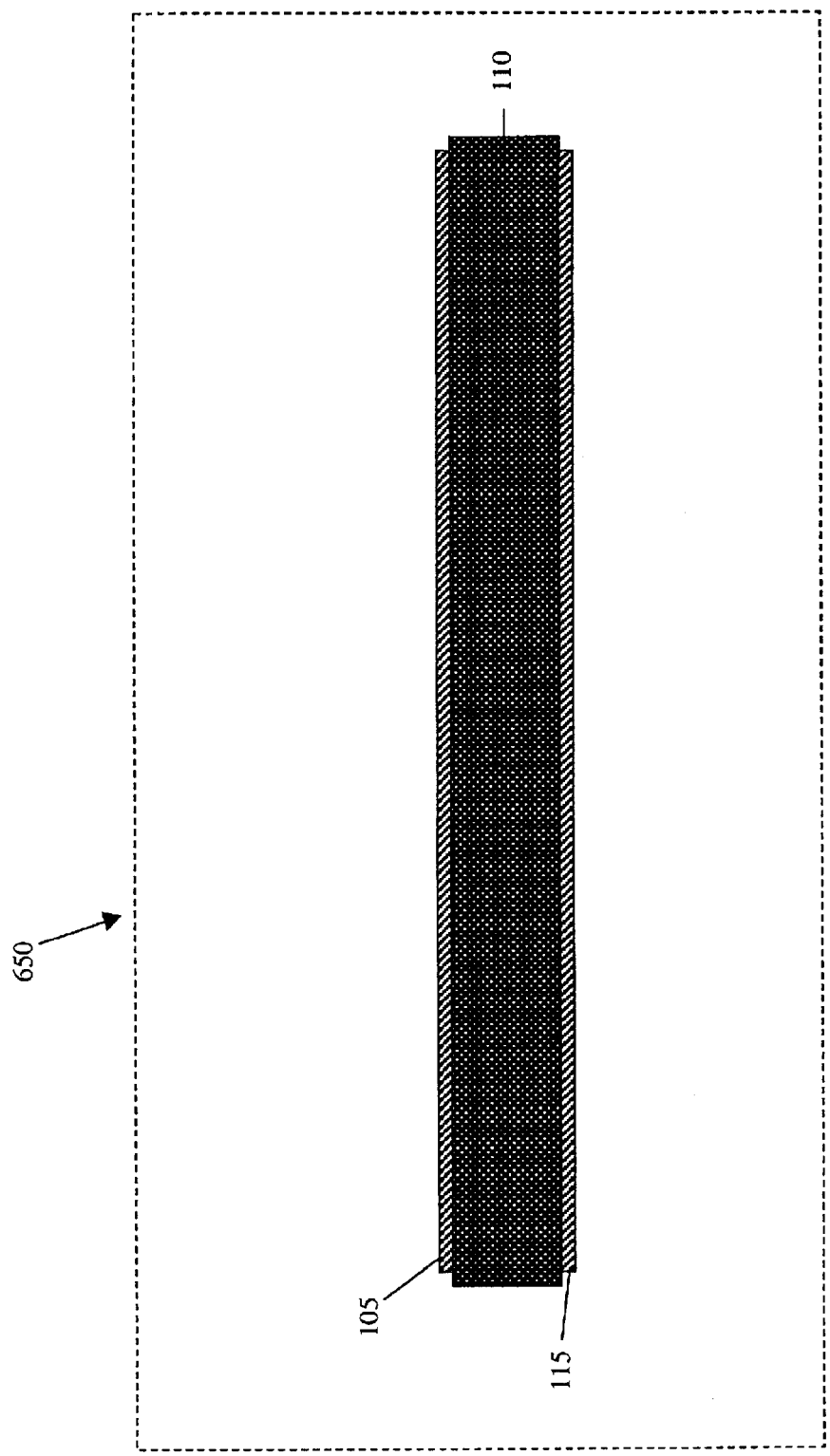

FIG. 7 is an illustration of a dual-sided, single dielectric layer, PCB.

Figure 8:
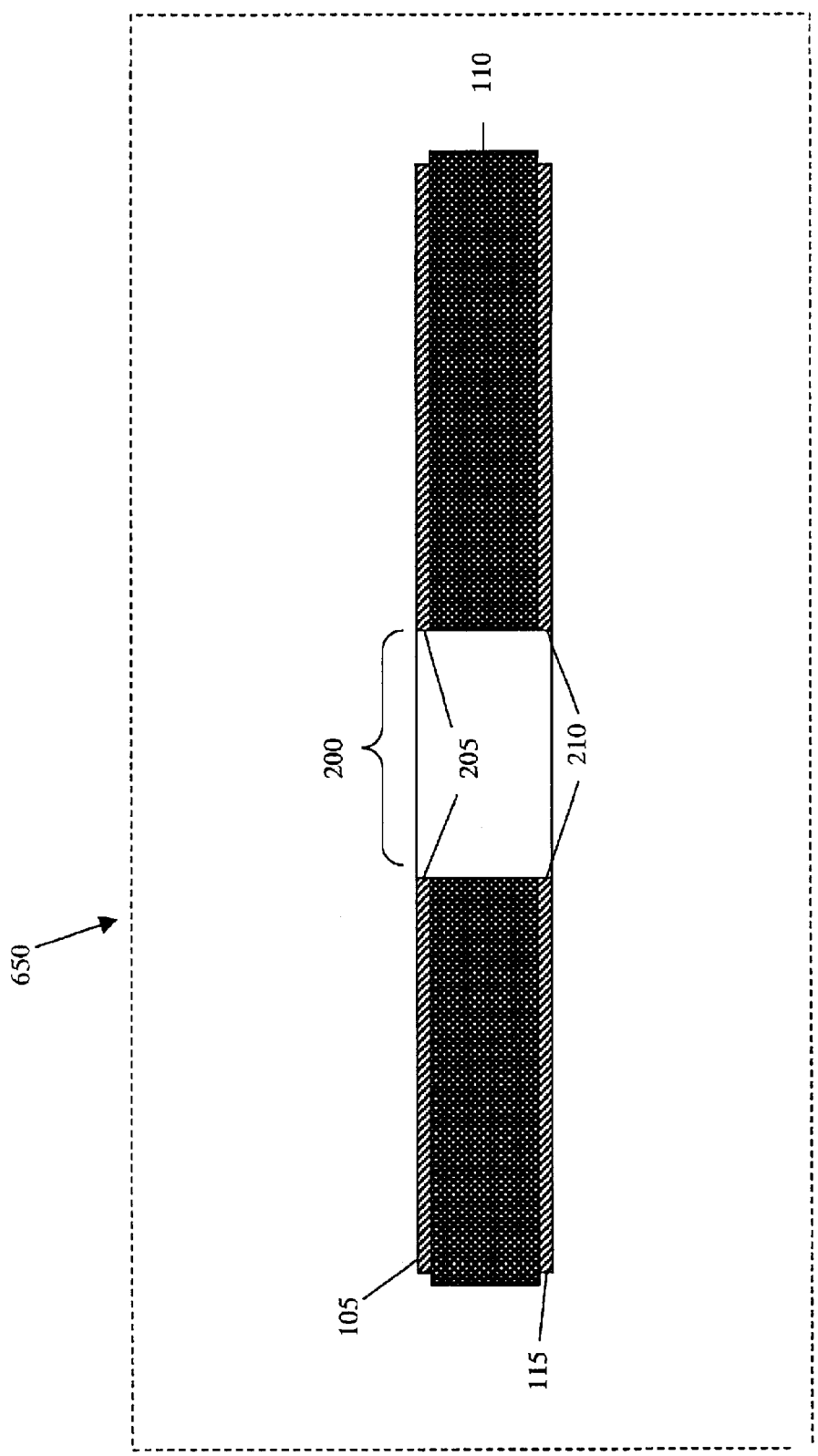

FIG. 8 is an illustration of a dual-sided, single dielectric layer, PCB with a hole formed through the PCB.

Figure 9:
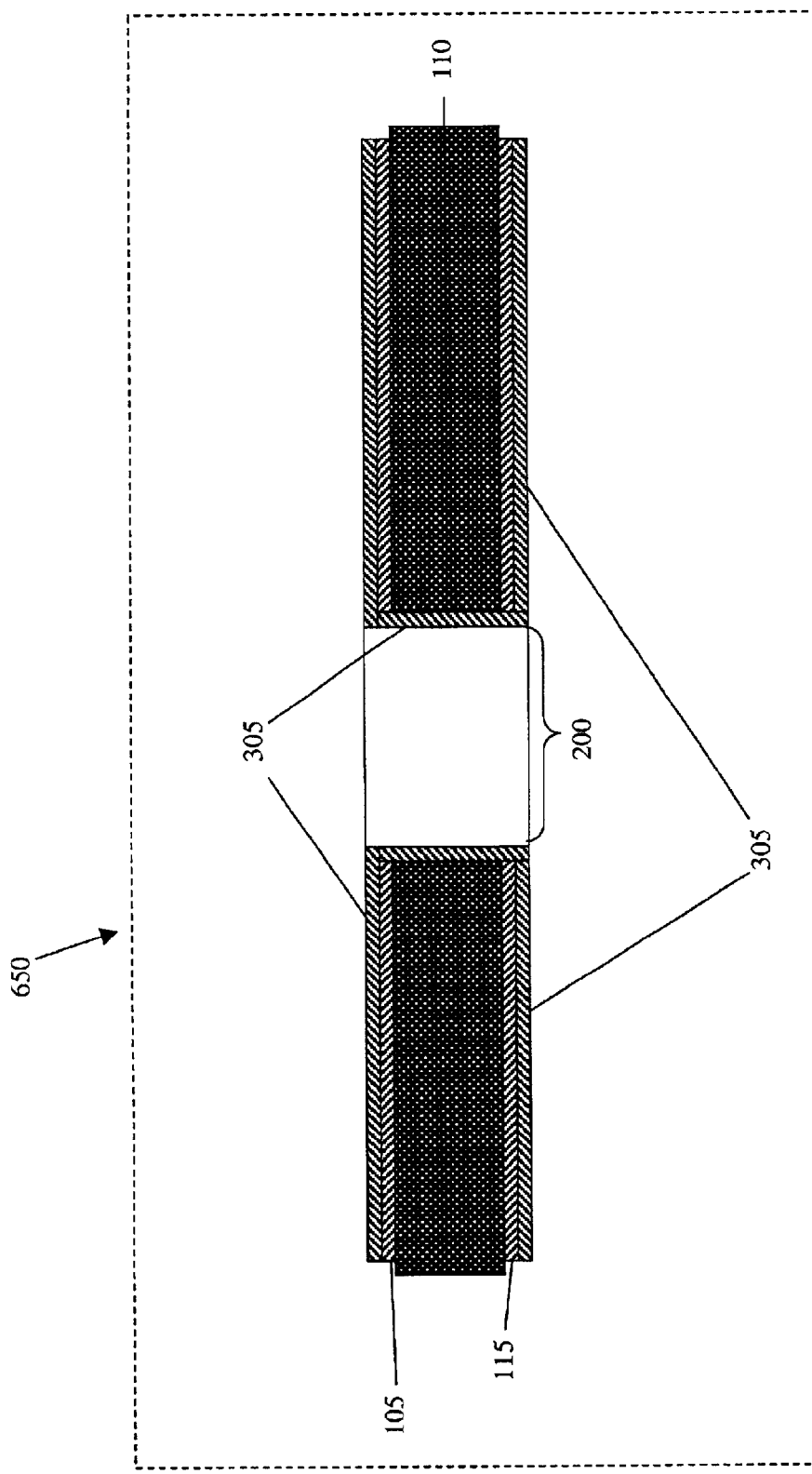

FIG. 9 is an illustration of a dual-sided, single dielectric layer, PCB with a hole formed through the PCB and a layer of conductor disposed on the walls of the hole.

Figure 10:
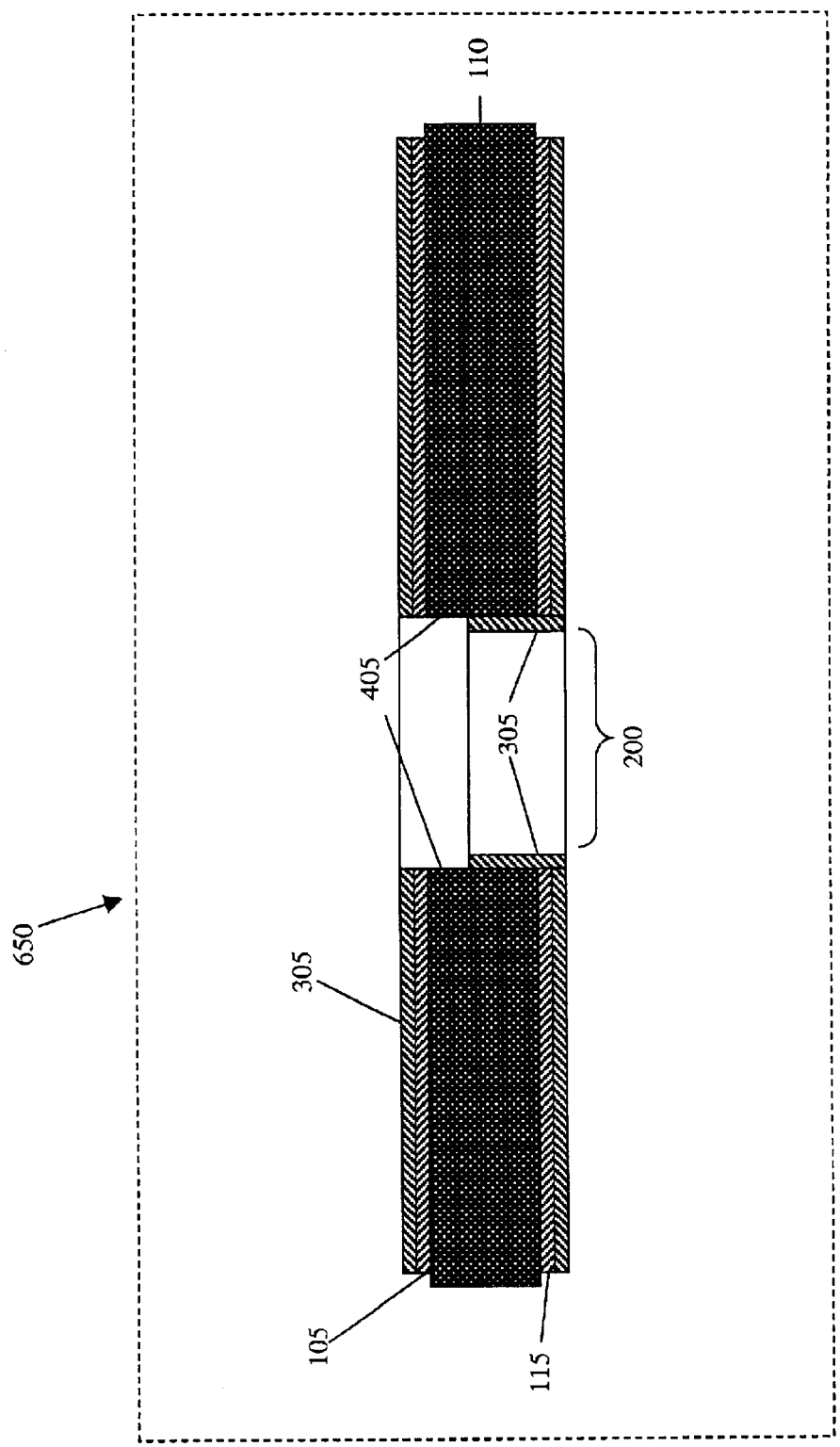

FIG. 10 is an illustration of a dual-sided, single dielectric layer, PCB with a hole formed through the PCB and a portion of a layer of the conductor removed from inside the hole.

Figure 11:
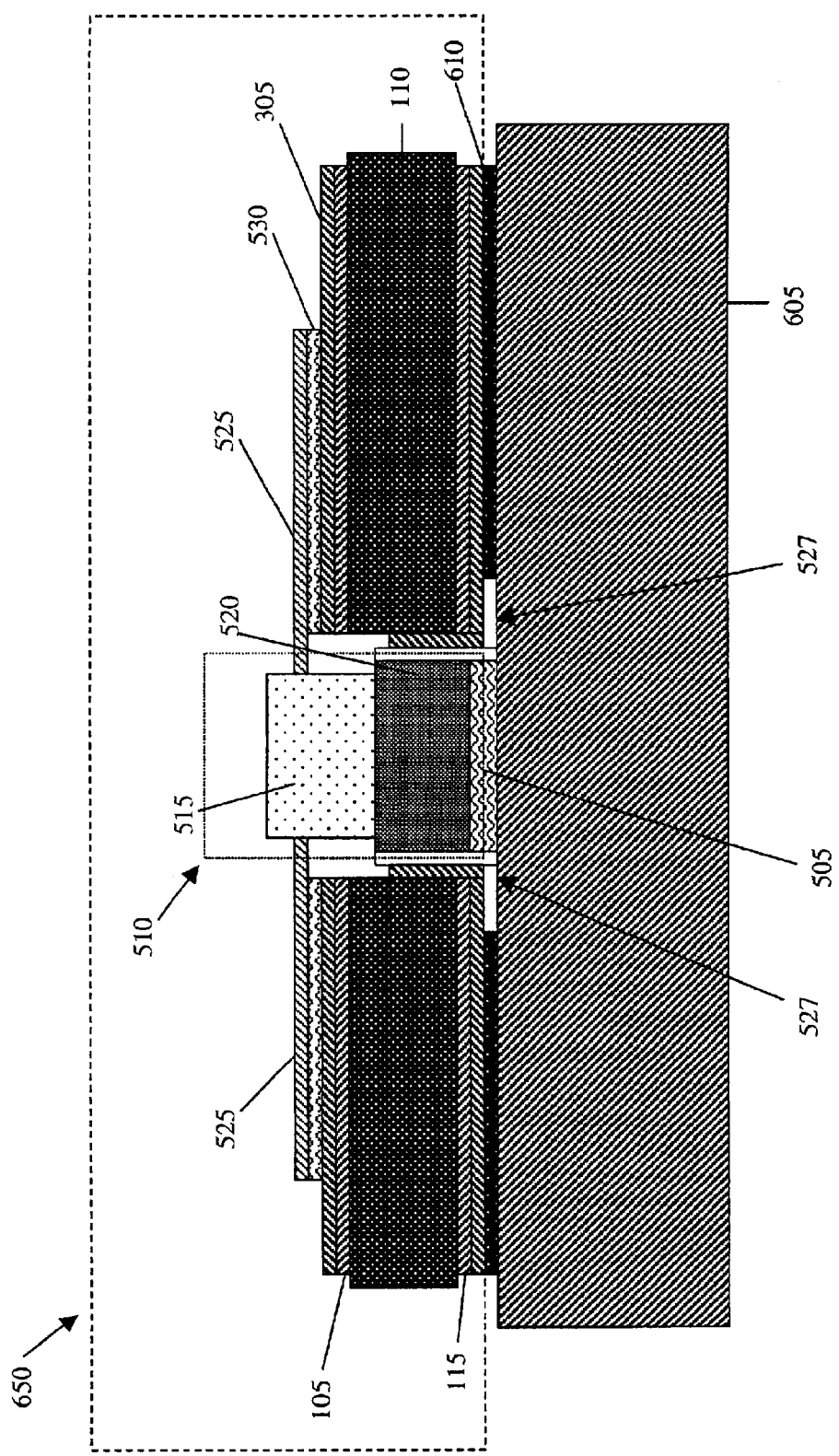

FIG. 11 is an illustration of a second embodiment of the dual-sided, single dielectric layer, PCB assembly having the multi-layer PCB of FIG. 10 disposed on a pallet with solder, a heat sink, an a component positioned in the hole.

Figure 12:
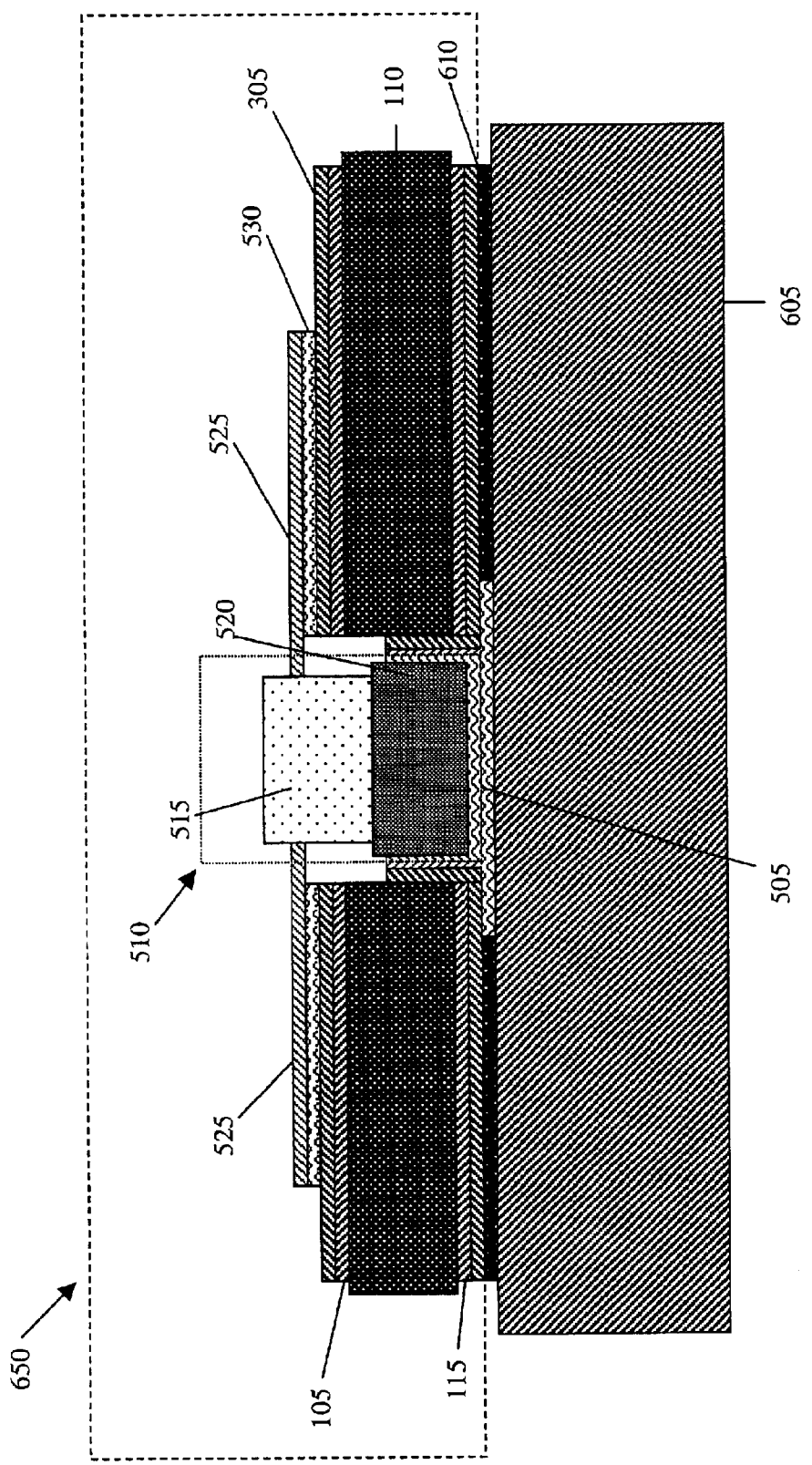

FIG. 12 is an illustration of the dual-sided, single dielectric layer, PCB assembly of FIG. 11 after heating.

Figure 13:
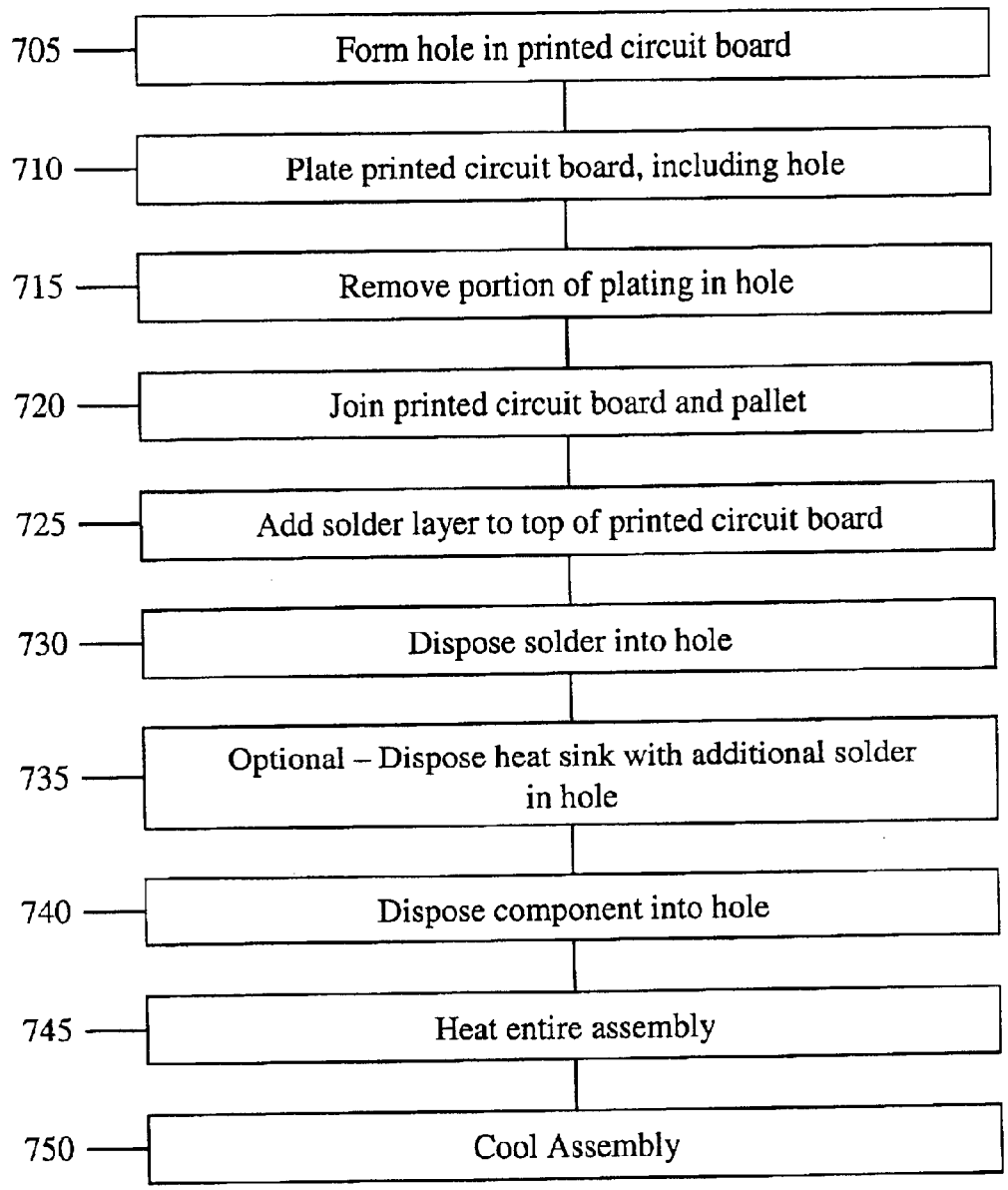

FIG. 13 is a flow chart which illustrates the steps of fabrication shown in FIGS. 2–6 and 8–12.

Third Embodiment

Figure 14:
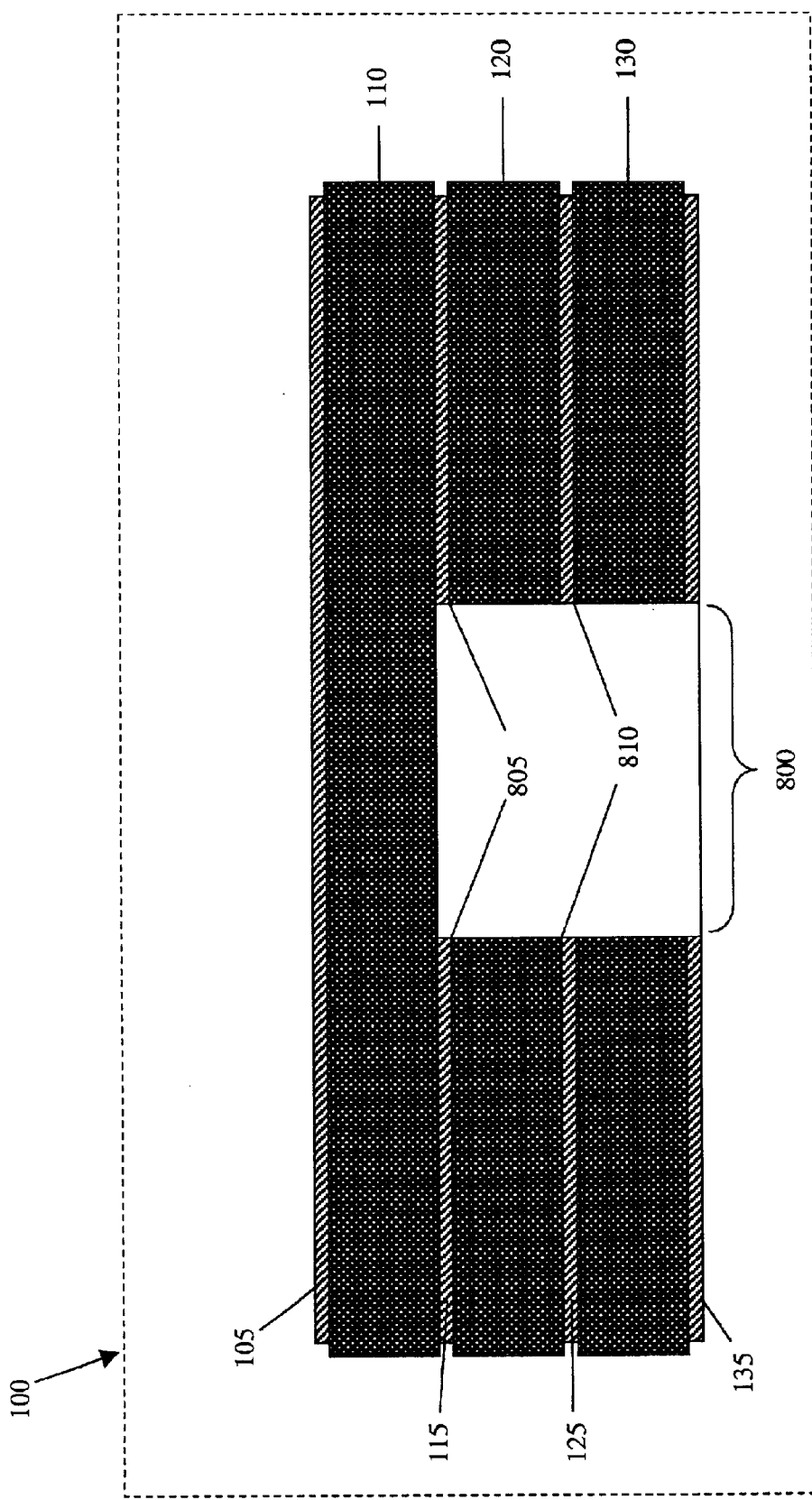

FIG. 14 is an illustration of a multi-layer PCB with a well formed from the bottom of the board.

Figure 15:
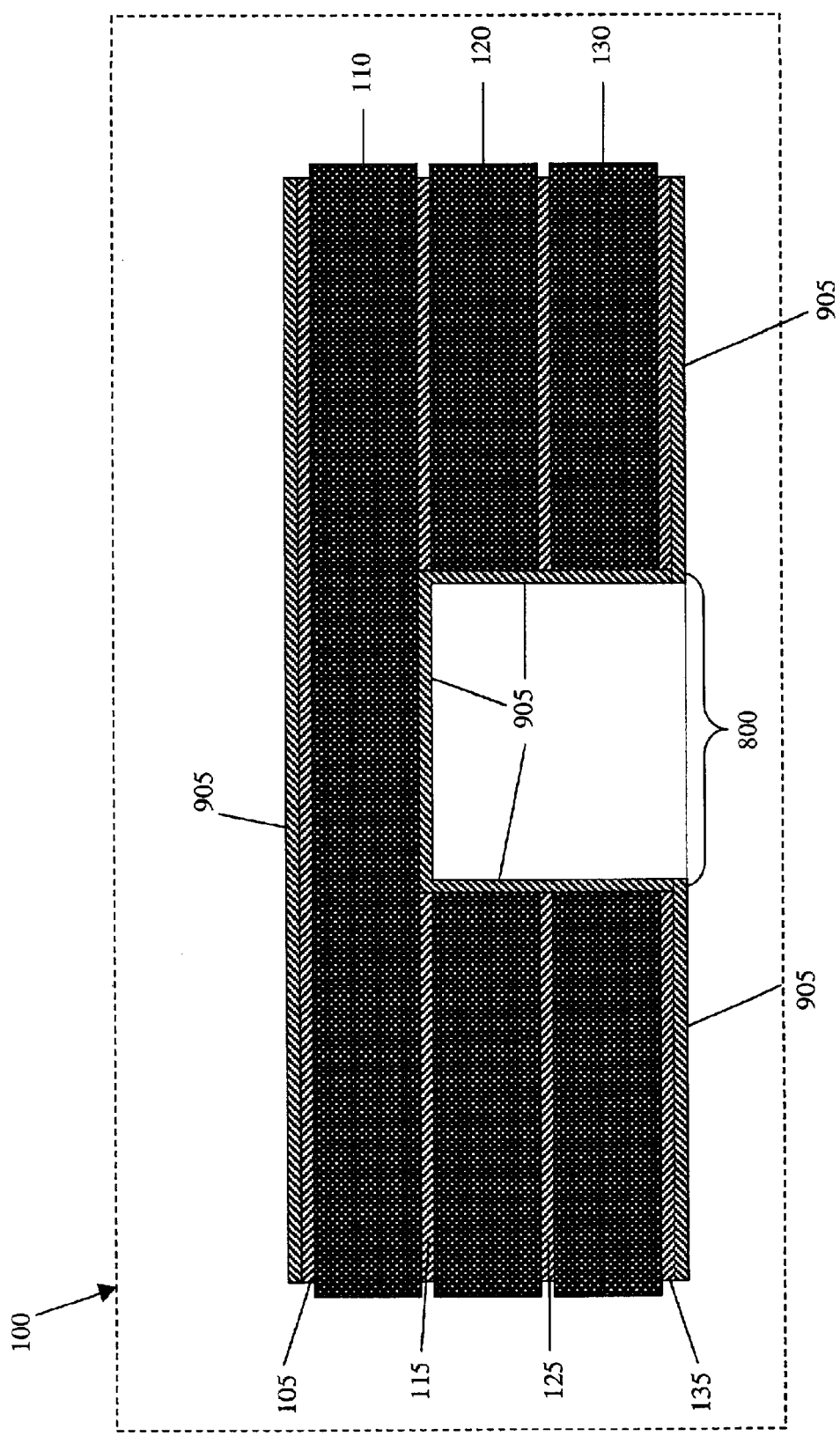

FIG. 15 is an illustration of the multi-layer PCB of FIG. 21 with a layer of conductor plated inside the well.

Figure 16:
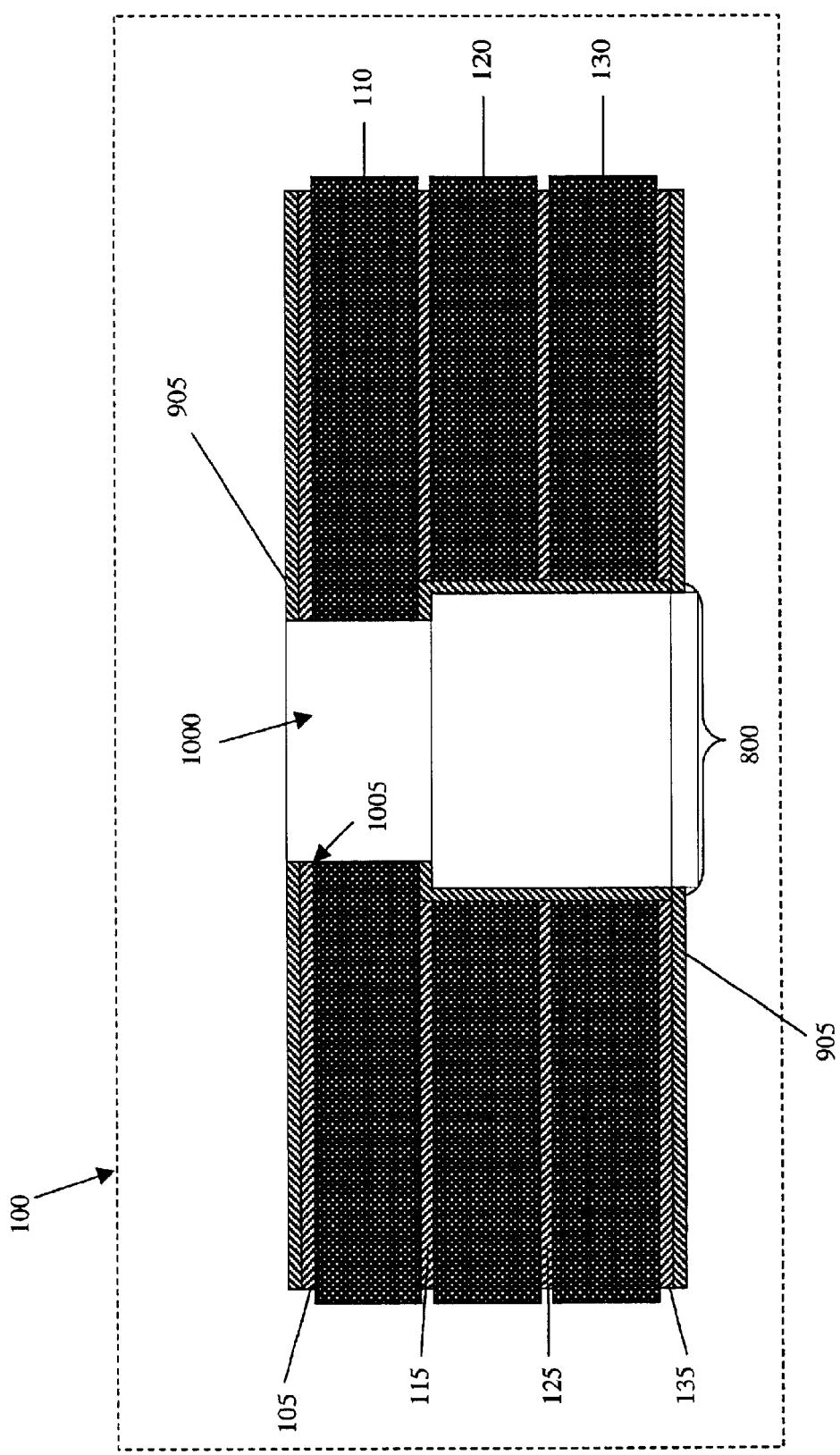

FIG. 16 is an illustration of the multi-layer PCB of FIG. 15 with a hole formed through the conductor and the remaining layers of the PCB.

Figure 17:
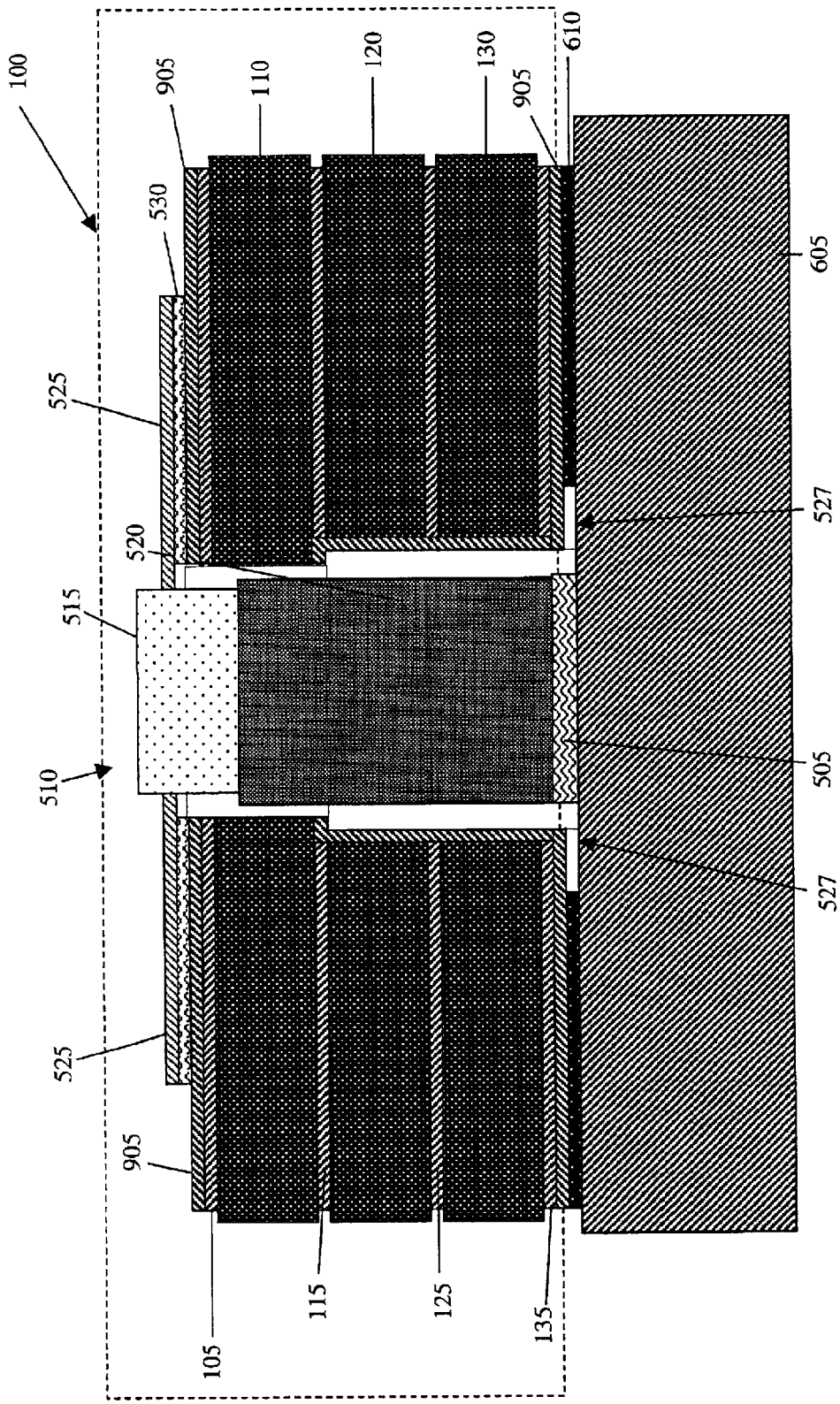

FIG. 17 is an illustration of a third embodiment of the multi-layer PCB assembly including the multi-layer PCB of FIG. 16 disposed on a pallet with solder, a heat sink, and a component positioned in the well and hole.

Figure 18:
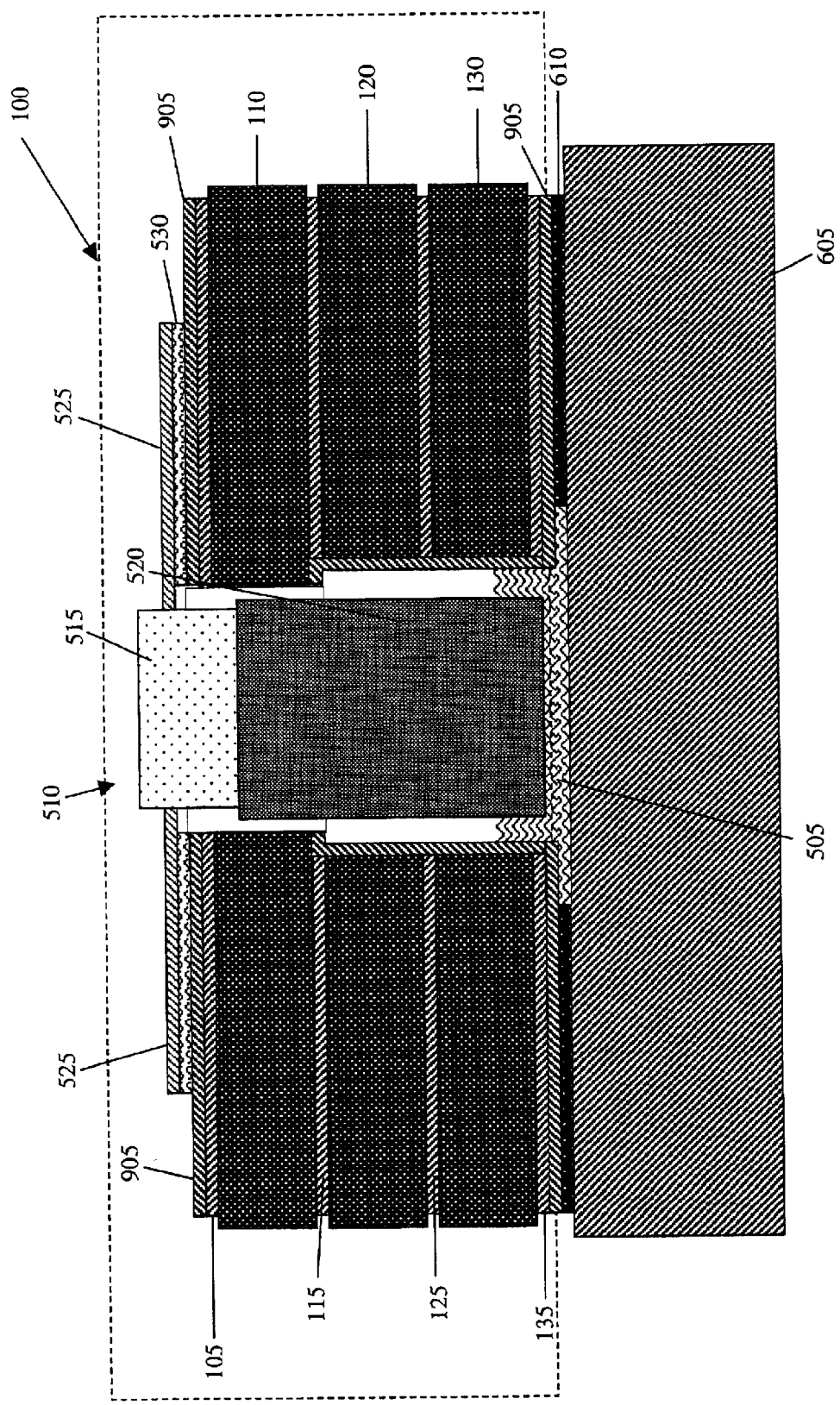

FIG. 18 is an illustration of the multi-layer PCB of FIG. 17 after heating.

Figure 19:
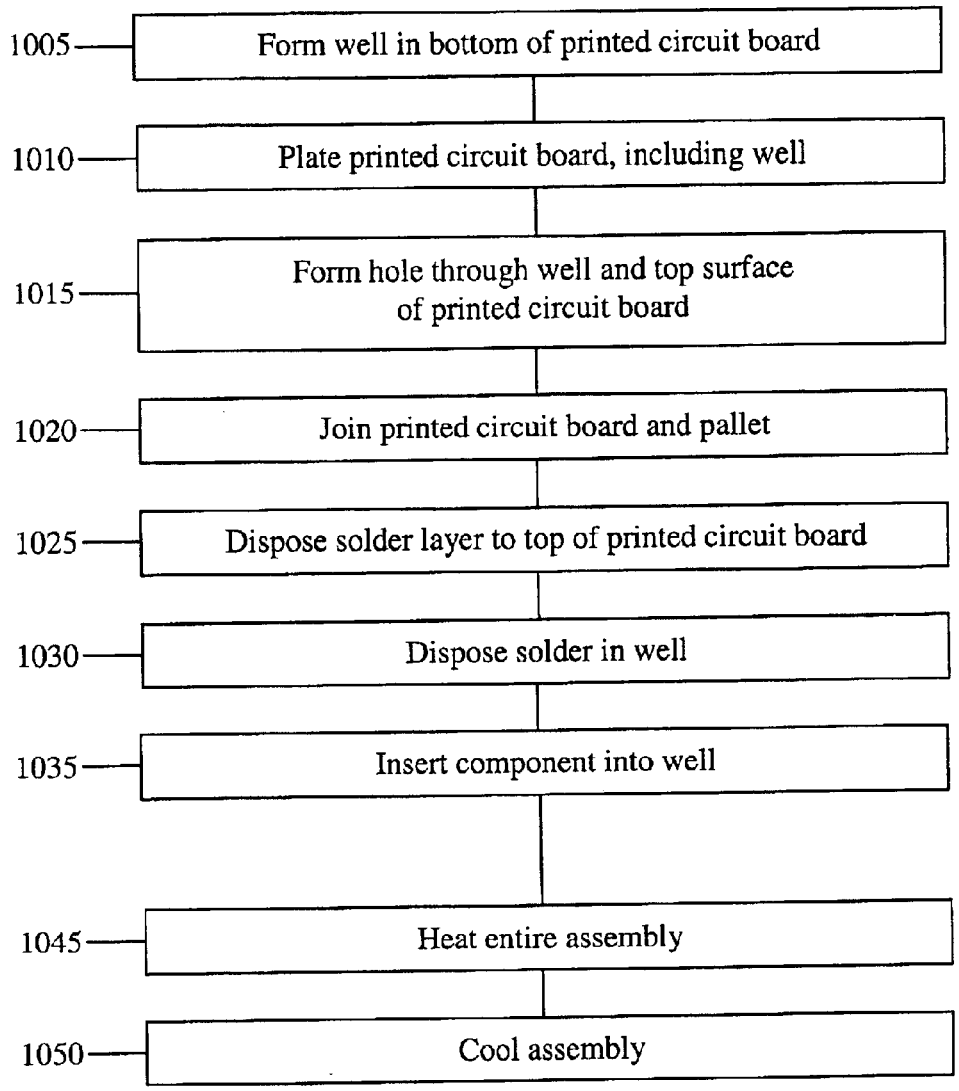

FIG. 19 is a flow chart which illustrates the steps of fabrication shown in FIGS. 14–18.

DETAILED DESCRIPTION

First Embodiment

Figure 1:
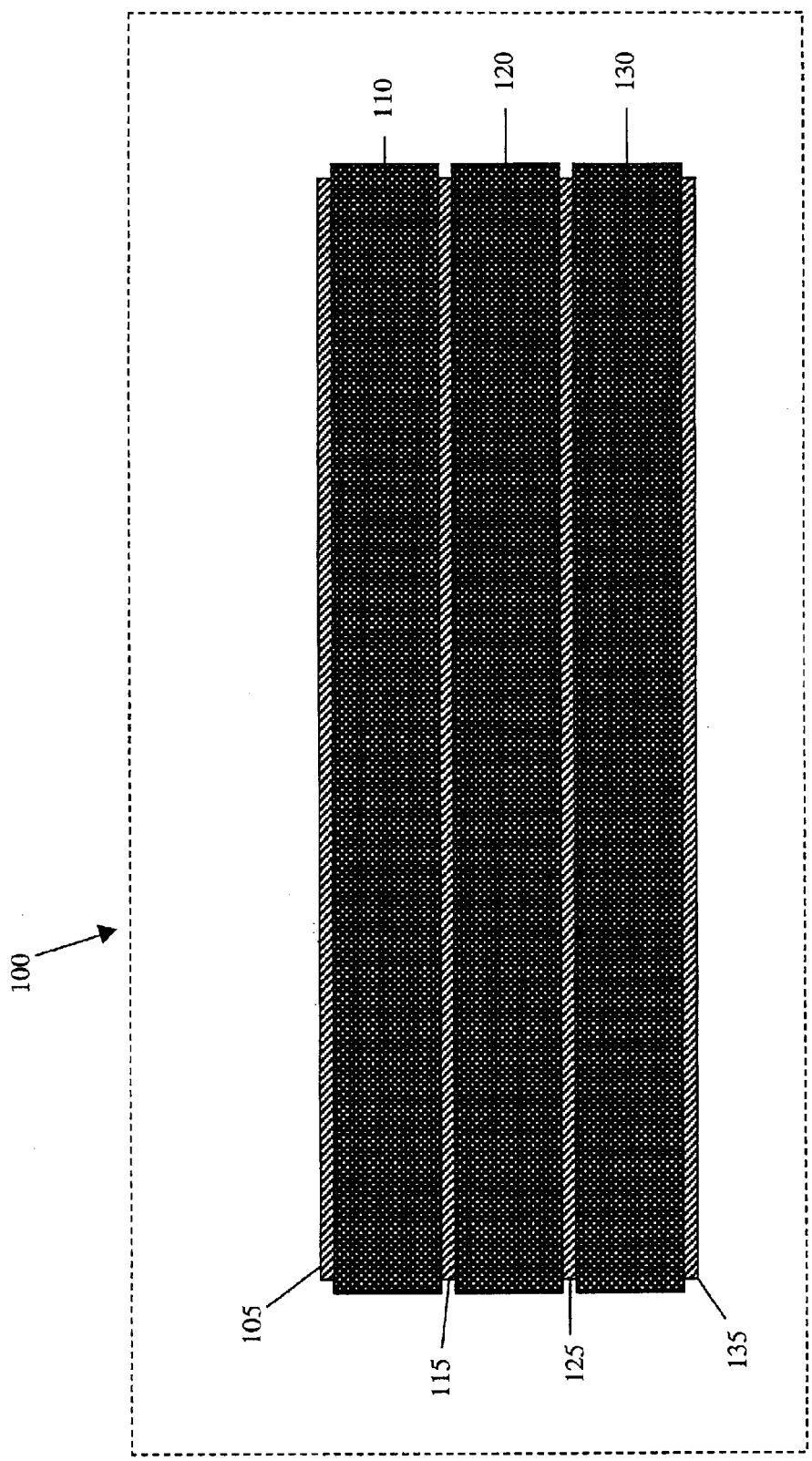
FIG. 1 is an illustration of a multi-layer PCB.

FIG. 1 illustrates a conventionally constructed multi-layer printed circuit board (multi-layer PCB) 100, which includes conductive circuit traces disposed in a plurality of planes 105, 115, 125 and 135 that are separated by insulating dielectric materials disposed in a plurality of planes (dielectric planes) 110, 120 and 130, respectively. Alternate embodiments of the multi-layer PCB 100 include more or fewer conductive planes and insulating planes, depending on the design of particular multi-layer PCB 100.

For example, a simple multi-layer PCB, such as a microstrip board, may include a first outer top conductive plane having the microstrip circuitry disposed in it. The microstrip board typically includes a second or bottom plane having a conductive ground plane disposed in it. The two conductive planes are separated by a first single dielectric plane, such as ceramic, glass-Teflon, glass-epoxy or the like.

As a further example, a microstrip board may have a second dielectric plane bonded to the ground plane with a third conductive plane disposed on the outer exposed surface of the second dielectric plane. Additional conductive planes may be added as desired by building up alternating layers of conductive planes and dielectric planes. In RF circuits, the first conductive plane added would typically be a ground layer that is attached, and electrically coupled to a pallet.

In the embodiment shown, conductive planes 105, 115, 125 and 135 are formed of copper, but any suitable conducting material may be used. As will be appreciated by those skilled in the art, conductive planes 105, 115, 125 and 135 may function as ground, voltage planes, conductive circuit (original) traces, or a mixture of functions. Often the microwave and RF circuit design includes a ground plane used to shield sensitive signal traces from RF or microwave circuitry which tends to interfere with the signals on the signal trace.

The thickness of planes 105 through 135 are not drawn to scale in FIG. 1. Conductive plane 105 may be formed of any convenient thickness. In the exemplary embodiments, plane 105 has a thickness of approximately 0.0042 inches. As is known to those skilled in the art, this thickness corresponds to approximately 3 ounces of copper per square inch.

Any or all of conductive planes 105, 115, 125 and 135 may include circuitry which has been formed, typically by etching, into conductive patterns in planes 105, 115, 125 or 135 by methods known to those of skill in the art. Such methods include, but are not limited to, chemical methods such as subtractive or "etched foil" methods and additive or "plated-up" methods, as well as mechanical methods such as stamping or die-cutting, metal-spraying, embossing and molding and the like.

For example, in the embodiment shown, conductive plane 105 includes a top circuitry layer formed by any of the foregoing methods or other methods. This top circuitry layer may include microstrip transmission lines, microstrip couplers, resistors and other components known to those skilled in the art. According to an embodiment, the top circuitry layer of conductive plane 105 comprises RF circuitry.

Although various configurations of conductive planes 115, 125 and 135 are possible, in the embodiments shown, conductive plane 115 is a ground plane layer. This configuration is desirable when the top circuitry layer of conductive plane 105 comprises an RF circuitry layer and conductive planes 125 and 135 comprise non-RF circuitry layers, because, in this configuration, conductive plane 115 shields the non-RF circuitry of conductive planes 125 and 135 from the RF circuitry of conductive plane 105.

Although conductive planes 115, 125 and 135 may be formed of any convenient thickness, in exemplary embodiments, the thickness of conductive planes 115, 125 and 135 is often in the range of 0.0014 to 0.0042 inches. This range of thickness corresponds to a range from approximately 1 to 3 ounces of copper per square inch.

Insulating planes 110, 120 and 130 may be formed of any convenient dielectric known by those skilled in the art, such as glass-epoxy or resin-preimpregnated glass cloth. With the configuration shown, it is advantageous to form conductive planes 105, 115, 125 and 135 on relatively rigid dielectric material such as glass-epoxy, then join, or laminate, the rigid layers that form individual printed wiring boards together with an insulating adhesive layer such as resin-preimpregnated glass cloth. Alternatively, a flexible PWB construction may be employed utilizing flexible layers.

In one such embodiment, insulating planes 110 and 130 are formed of a rigid insulator, such as glass-epoxy, and are joined together by insulating plane 120, which is formed of an adhesive dielectric material. In one such embodiment, insulating plane 110 is formed of R04350 C2/C2 having circuitry etched from the 2 oz. copper disposed on each side. Insulating plane 130 is formed of FR4 C1/C1, a glass-epoxy material having 1 oz copper disposed on each side, and insulating plane 120 is formed of resin-preimpregnated glass cloth, such as 7628 Pre-Preg.

As will be appreciated by those skilled in the art, the designations C2/C2 and C1/C1 refer to dielectric materials having 2 oz. copper disposed on both sides and 1 oz. copper disposed on both sides respectively. Dielectric planes are typically supplied by manufacturer with copper disposed on one or more sides. The planes are typically etched, and often plated to increase signal carrying capability, attached to form conductive patterns and subsequently bonded together by the PCB manufacturer. R04350 is a type of dielectric and FR4 is a type of glass-epoxy dielectric material.

Insulating planes 110, 120 and 130 may be formed of any convenient thickness. However, this thickness will generally be constrained by the desire to achieve a given capacitance across the insulating plane, as provided in the circuit design for the multi-layer PCB 100. In one embodiment, where insulating planes 110, 120 and 130 are formed of the materials described in the preceding paragraph, insulating plane 110 is 0.030 inches thick, insulating plane 120 is 0.007 inches thick and insulating plane 130 is 0.008 inches thick.

Figure 2:
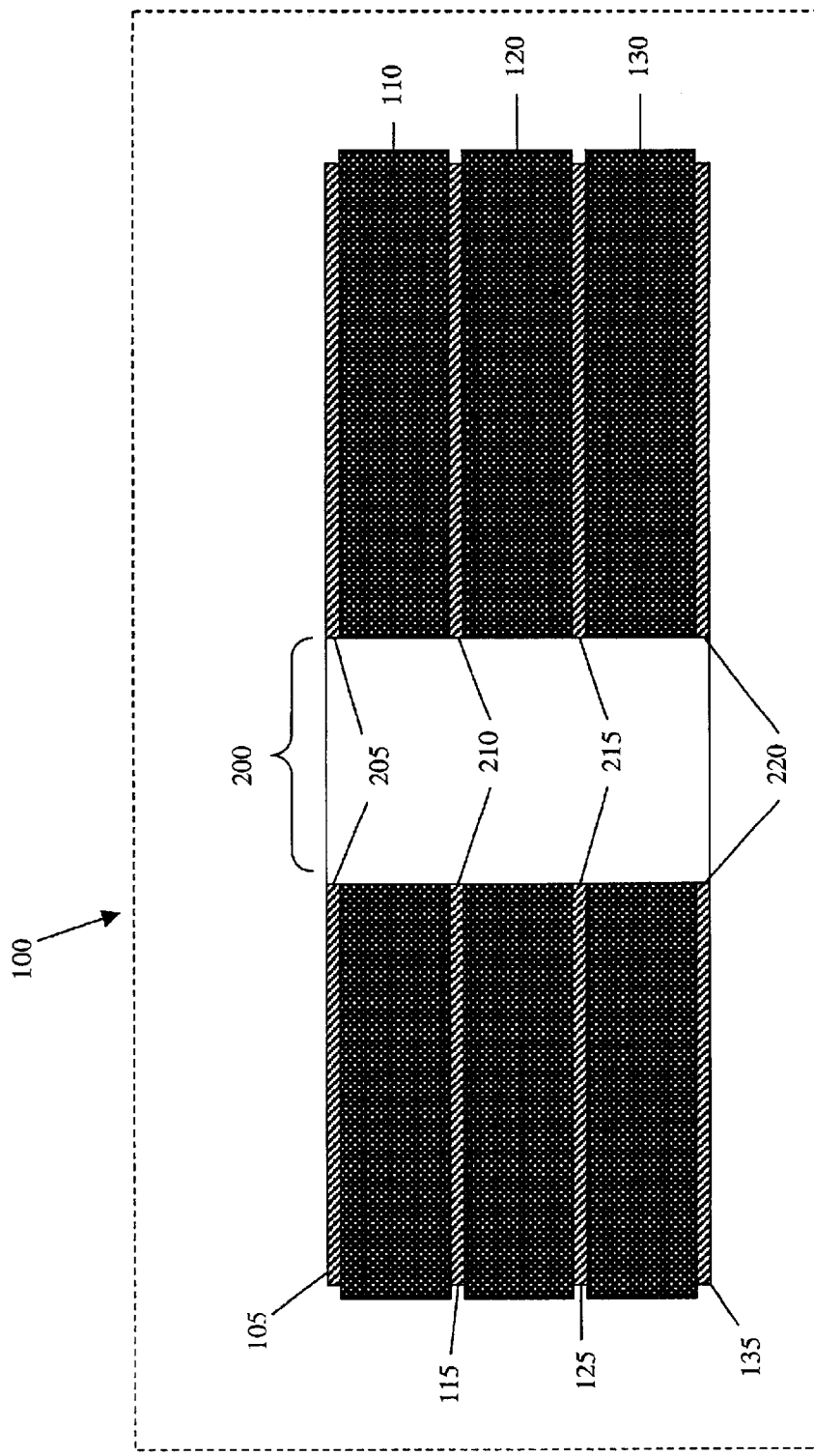
FIG. 2 is an illustration of a multi-layer PCB with a hole formed through the PCB.

FIG. 2 is an illustration of a multi-layer PCB 100 with a hole 200 formed through the multi-layer PCB. As shown, according to one method provided by the present invention, a first step in preparing multi-layer PCB 100 for attaching a large component is to form a hole 200 through conductive planes 105, 115, 125 and 135, and insulating planes 110, 120 and 130. Hole 200 may be formed of any method known to those of skill in the art, including routing, drilling and punching. Hole 200 should be large enough to accommodate both the component and any necessary conducting and/or adhesive material which may be disposed between the component and edges 205, 210, 215 and 220 formed in conductive planes 105, 115, 125 and 135, respectively, by hole 200.

Figure 3:
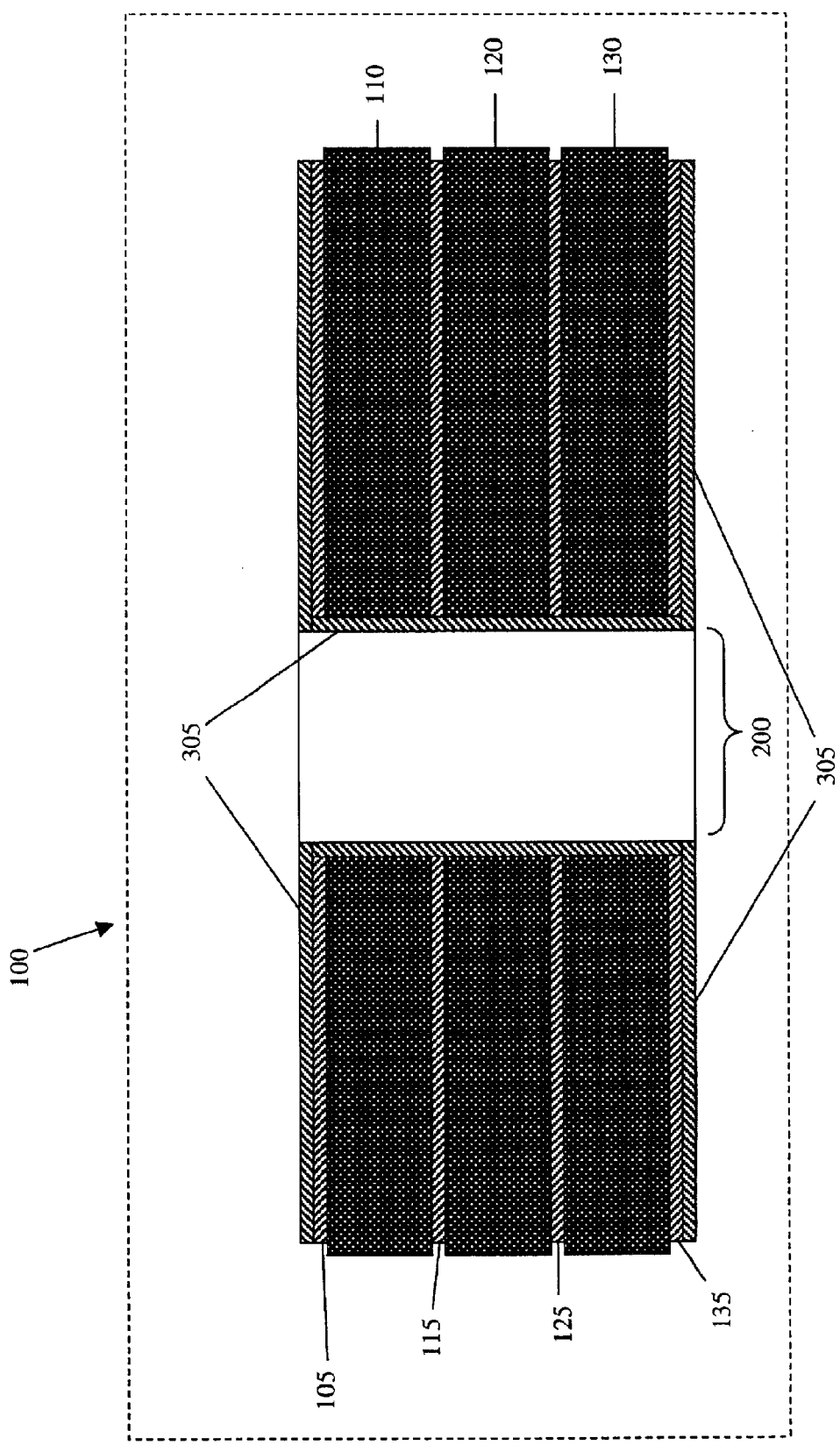
FIG. 3 is an illustration of a multi-layer PCB with a hole formed through the PCB and a layer of conductor disposed on the walls of the hole.

FIG. 3 illustrates the multi-layer PCB 100 with a hole 200 formed through it and a conductive layer 305 disposed inside the hole 200. In this step, the multi-layer PCB 100, including the walls of hole 200, are plated with a conductor. Any convenient conductor suitable for deposit may be disposed in this plating step. In some embodiments, plating 305 is formed by disposing copper on the walls of hole 200 according to techniques known to those of skill in the art. Accordingly in some embodiments, plating 305 is formed by electrodeposition of a conductor on the multi-layer PCB 100. Plating 305 could be deposited in a range of thicknesses, but is generally formed with a thickness in the range of 0.001 to 0.003 inches. In an embodiment, plating 305 has an average thickness of approximately 0.0024 inches.

Figure 4:
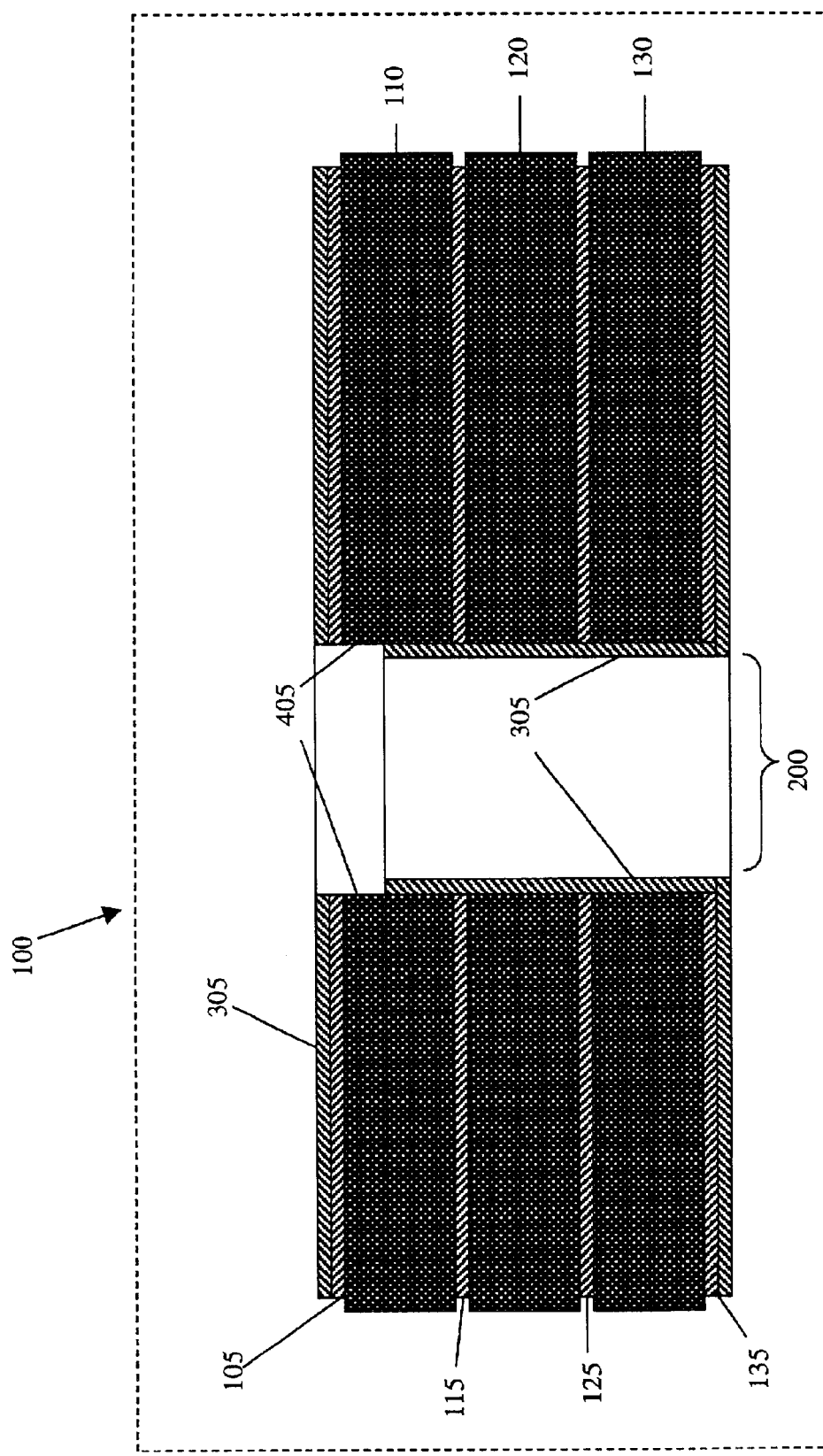
FIG. 4 is an illustration of a multi-layer PCB with a hole formed through the PCB and a portion of a layer of conductor removed from inside the hole.

FIG. 4 is an illustration of the multi-layer PCB 100 having a portion of the plating removed from inside the hole 200. Removal may be accomplished by routing, drilling, chemical methods and the like, as known to those skilled in the art. In FIG. 4, a portion of plating 305 is removed from area 405 of hole 200. Removing this portion of plating 305 from area 405 disconnects conductive plane 105 from the ground connection formed by plating 305 to conductive planes 115, 125, and 135. In some embodiments, the size of area 405 is controlled to maintain coupling between plating 305 and conductive planes 115, 125 and the conductive ground plane 135 that is at the bottom of the stack.

Maintaining this contact, or coupling, is particularly desirable when conductive plane 105 includes an RF circuitry layer and conductive plane 115 is a ground plane layer which shields non-RF circuitry contained in conductive plane 125 or 135. In particular, conductive plane 105 may contain microstrip transmission lines and components. Thus, the thickness of dielectric layer 110 disposed between conductive planes 105 and ground plane 115, as well as the material's relative dielectric constant tends to determine microstrip transmission line parameters.

In a particular exemplary embodiment, dielectric layer 110 may be a material especially suited for high frequency circuits (such as those that would utilize microstrip transmission lines and circuitry). For example, layer 110 may be glass-Teflon (GT, GX), ceramic loaded Teflon, polymide (G30), ceramic or their equivalent.

In the exemplary embodiment, the remaining dielectric layers 120, 130 on either side of the conductive plane 125, having conventional circuitry disposed on it, may be made of a less specialized material suitable for non-microwave circuits such as small signal analog and digital circuits. For example, phenolic, glass-epoxy (G-10, FR-4 and the like).

In addition, as known to those skilled in the art, to maximize shielding between RF (or microwave) and low frequency or digital circuits disposition of components on the multi-layer board may be controlled. Typically, RF components are disposed on an upper RF circuitry plane 105, and digital or low frequency analog components and circuitry are disposed on plane 135 in areas isolated from the upper RF circuitry plane. Isolation is typically achieved by providing etched back areas to separate the circuitry. In addition, if a heat sink is coupled to or mounted against conductive area 135, the heat sink is typically machined or routed away to provide mechanical clearance for any parts and circuitry disposed on the layer 135 that is not part of the predominant ground plane.

Figure 5:
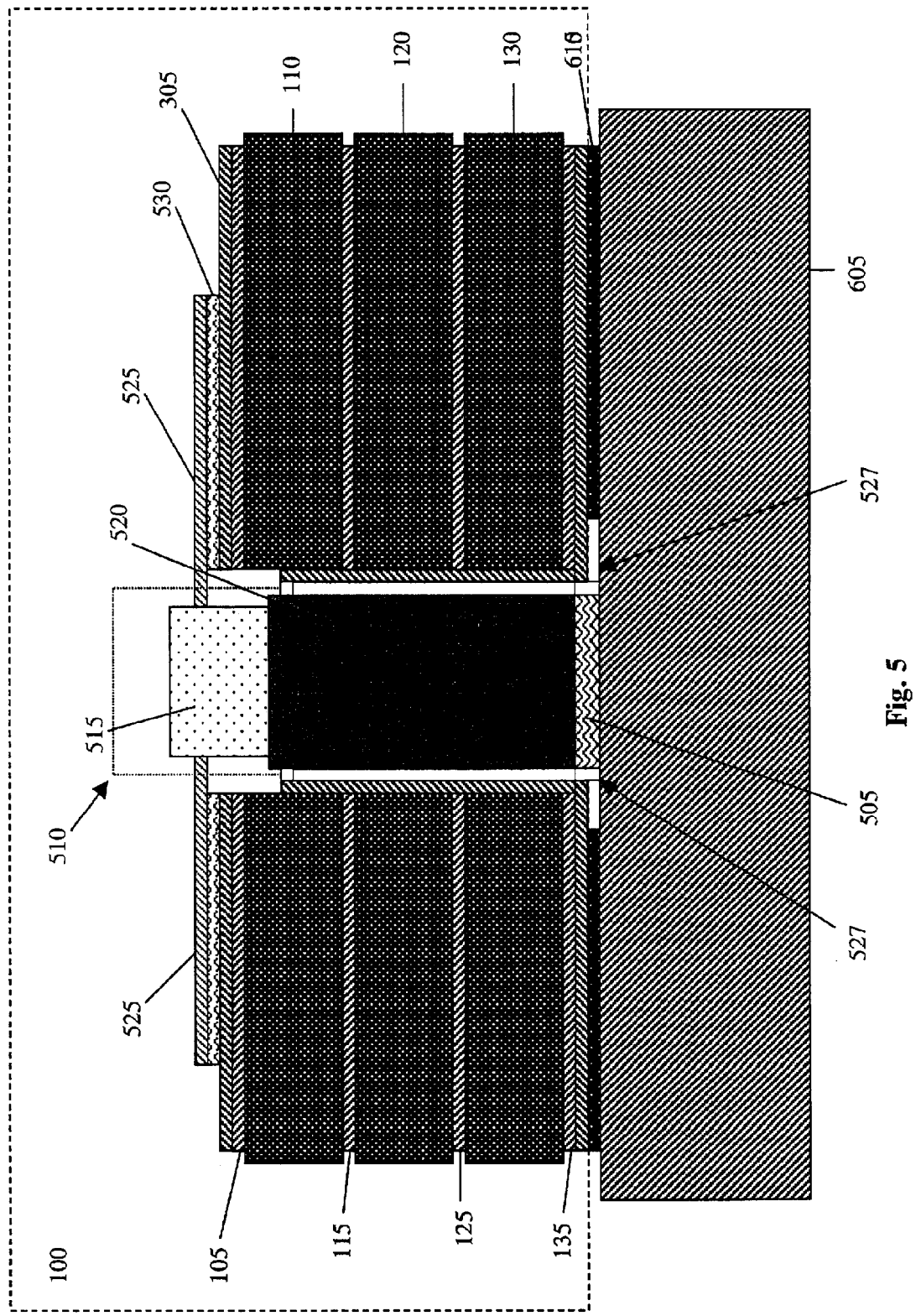
FIG. 5 is an illustration of the first embodiment of the multi-layer PCB assembly, having the multi-layer PCB of FIG. 4 disposed on a pallet with solder, a heat sink, and a component positioned in the hole.

FIG. 5 illustrates the multi-layer PCB 100 attached to a pallet 605 by adhesive, or bonding material 610. Pallet 605 acts as a heat sink and an electrical ground. In an alternative embodiment attachment may be made by soldering. Thus, pallet 605 should be composed of a conducting material which has a relatively large heat capacity. Pallets are often typically mounted to a finned heat sink for air cooling by a fan or convection. Although pallet 605 may be composed of a variety of conducting materials, in some embodiments of the present invention, pallet 605 is formed of copper. Alternatively, as will be appreciated by those skilled in the art, aluminum, copper plated graphite composite material, steel or the like may be used, depending upon the heat transfer requirement of the particular application. To act as an effective heat sink, pallet 605 is typically made thicker than conducting layers 105, 115, 125, and 135 and plating 305. The pallet 605 may be in the range of 10 to 100 times thicker than the conducting layers 105, 115, 125, and 135 or plating 305. In an exemplary embodiment, pallet 605 is formed of copper and is 0.157 inches thick.

Adhesive material 610 may be made of any convenient adhesive, either electrically conductive, or not. Also, the adhesive used need not have particularly good heat transfer characteristics. Cost effective manufacture would point to an inexpensive pre-impregnated sheet material, which is an insulating material, or its equivalent. In some such embodiments, adhesive material 610 is composed of resin-preimpregnated glass cloth. In alternative embodiments, adhesive material 610 may be composed of non-conductive epoxy or other similar adhesives.

In a further exemplary embodiment, adhesive material 610, is "no-flow" resin-preimpregnated glass cloth, which is designed to retain its shape when heated above the melting point of solder. If no-flow resin-preimpregnated glass cloth is utilized, the no-flow resin-preimpregnated glass cloth advantageously prevents the flow of solder into the space occupied by adhesive material 610, and adhesive material 610 will not flow into the space occupied by the solder 505. Thus, the solder joint remains free of impurities from the bonding material.

A component 510, a heat sink 520, and a pre-formed piece of solder ("solder preform") 505 are disposed within hole 200. As noted above, component 510 could be any component having a size large enough to take advantage of the special processing of multi-layer PCB 100 as is described here. For example, such components might include, but are not limited to, rectifiers for a power supply, high-power transistors and high-power attenuators. Components may include those having a flange solely for heat sinking purposes, or those having a flange for grounding and heat sinking purposes. Alternatively, components may include flangeless parts designed with a bottom surface suitable for direct attachment to a pallet or heat sink.

In the embodiment shown, component 510 is a flanged high-power RF transistor or the like. Component 510 typically includes a body 515 having a semiconductor die covered by an alumina lid. The die is typically disposed on a spacer (not shown) of a ceramic material such as BeO or alumina that advantageously conducts heat away from the die. Typically, a metallic base or heat sink 520 is coupled to the body 515 to facilitate heat dissipation and transfer away from the die. Heat sink 520 is typically copper or a metal plated with a conductor such as copper or nickel. Heat sink 520 may also have additional layers of plating, e.g., of gold or nickel. Typically, the heat sink is coupled to portions of circuitry in the die that are at zero electrical potential or ground.

Leads 525 electrically couple the die in component 510 to circuitry in the conductive plane 105. In an embodiment, conductive plane 105 includes an RF circuitry layer, and leads 525 connect component 510 to the RF circuitry in layer 105. In alternative embodiments, a plurality of leads are provided, some of which are coupled to circuitry, and some of which are coupled to ground circuitry disposed in plane 105 and typically coupled to the ground layer 135 through a plurality of related through holes of edge plating.

The solder preform 505 is disposed within the hole 200 between the heat sink 520 and the pallet 605. As will be appreciated by those skilled in the art, solder preforms are typically precision-manufactured solder parts made to a shape desired for a particular application. Typically, a solder preform 505 is manufactured by punching a strip of solder alloy with a die of the desired shape.

Alternatively, the solder preform 505 is stamped from laminated metal systems which include solder. Examples of metals used in such laminated metal systems include laminated copper-solder and solder-copper-solder. Strips of these material systems are typically made by disposing molten solder alloy onto one or more sides of a copper strip and then skiving the solder alloy to the desired thickness to allow for a close fit.

Alternative embodiments of the solder preform 505 include a flux as an integral part of solder preform 505 or a coating of flux to be applied to solder preform 505. Flux is a compound that typically etches away oxidation when heated to aid wetting so that both a mechanically and electrically sound solder joint is produced. Embodiments that include flux as part of solder preform 505 may be made by punching the preform from a flattened piece of core solder, resulting in a sandwich structure which has flux in the center and solder alloy on the outside. Preforms made in this fashion typically provide very precise control over the final dimension of the part.

Using the solder preform 505 to join component 510 to the multi-layer PCB 100 provides a number of advantages over other types of connectors, and other forms of soldering. Solder preform 505 provides solder in a carefully controlled shape and volume, which aids in joint formation, and helps to ensure that a joint is formed in areas specified by the designer and nowhere else. Accordingly, the use of the solder preform 505 lessens dependence on operator skill and judgment. With regard to the assembly of the multi-layer PCB 100 the use of solder preform puts more control regarding the final product in the hands of the designer. However, in alternative embodiments of methods of fabricating the multi-layer PCB 100, solder paste (or cream), other forms of solder, or conductive adhesives (such as conductive epoxy) may be used in place of the solder preform 505.

The solder preform 505 is typically flat and lies in the bottom of the well formed by the hole 200 and molten solder from the solder preform 505 flows into voids 527 below multi-layer PCB 100 when the assembly is heated and may wick up the plated walls of the hole. When heated, the solder that makes up the solder preform 505 will flow between the multi-layer PCB 100 and the heat sink 520. This solder connection forms a good RF ground between the PWB, the component and the pallet. A good heat transfer path is also formed from the component to the pallet.

Layer 530 is typically a solder connection that attaches leads 525 of component 510 to form an electrical contact with plating layer 305 at the top of the multi-layer PCB 100. In some embodiments, layer 530 is formed of a solder paste. Equivalently, layer 530 may be formed of a conducting adhesive or similar material.

In the embodiment shown, layer 530 is applied to a portion of the top surface of multi-layer PCB 100 before component 510 is inserted into hole 200. Typically solder paste is applied to the top of the multi-layer PCB 100 with a silk screen, or similar application process. The silk screen process leaves solder paste in desired portions of layer 530 where components will be soldered.

Next, the assembly is heated to a temperature slightly above the melting point of solder. The heating process melts preform 505 and the solder in layer 530, if any. When the assembly is cooled, component 510 is securely joined to multi-layer PCB 100. In fabrication, registration pins are typically utilized in a manner known to those skilled in the art to maintain PCB-to-pallet alignment during the heating and pressing of the bonding process.

Figure 6:
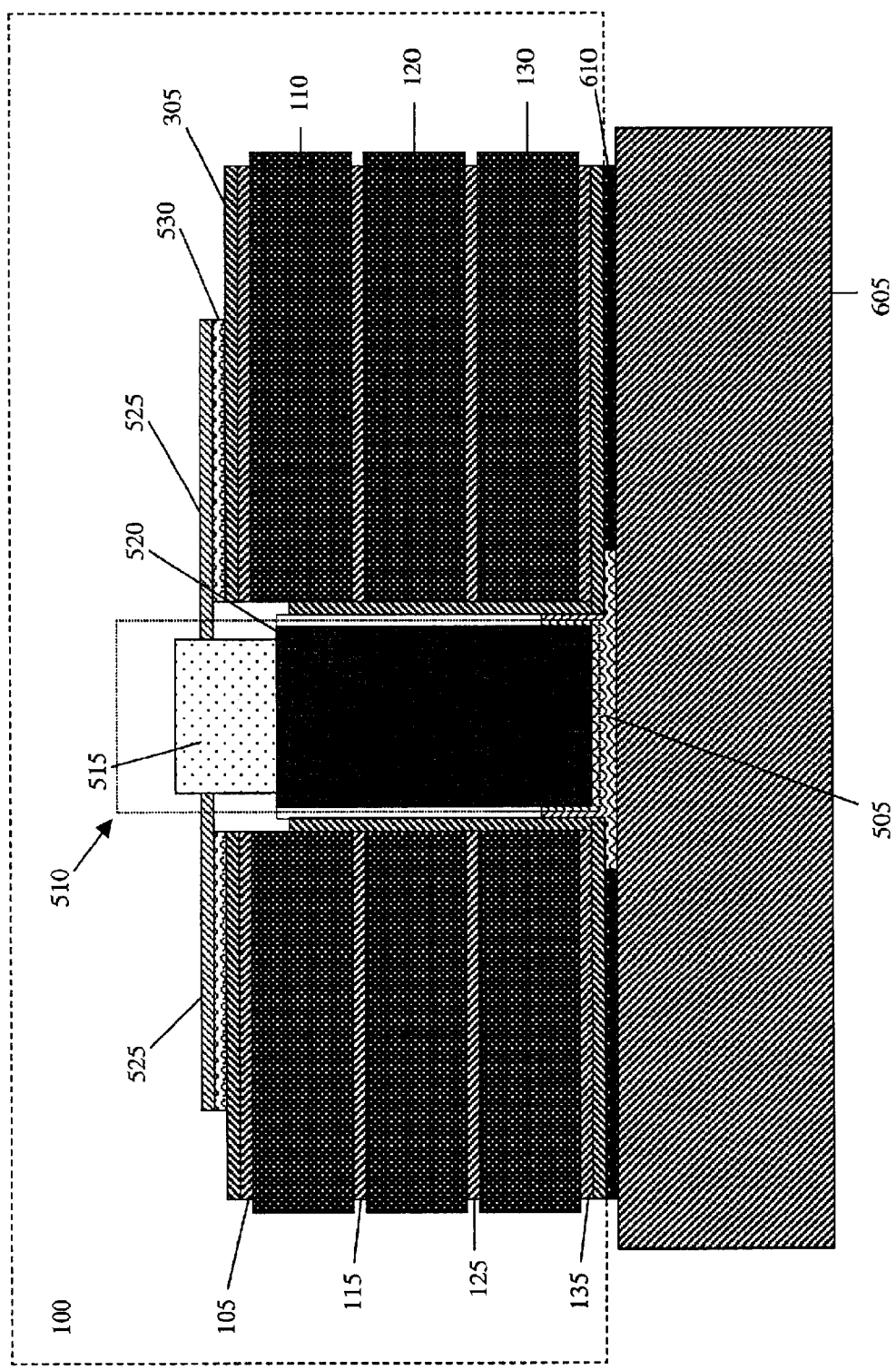
FIG. 6 is an illustration of the multi-layer PCB assembly of FIG. 5 after heating.

The solder that makes up the solder perform 505, when heated, will flow in the gapped area between the multi-layer PCB 100 and the pallet 605, and typically somewhat up the walls of the hole, depending upon the amount of solder present, forming an interconnecting solder layer 615 as shown in FIG. 6.

Second Embodiment

FIGS. 7–12 illustrate embodiments of a dual-sided, single dielectric layer, PCB 650 that are analogous to the embodiments respectively illustrated in FIGS. 1–6 implementing the multi-layer PCB 100. However, in this embodiment, an electrical ground connection is not present in an interior layer. In an effort to maintain commonality, the reference numbers associated with components in FIGS. 7–12 are the same as the reference numbers used for the analogous components in FIGS. 1–6.

FIG. 13 is a flow chart setting forth the steps of fabrication according to an embodiment of a method of producing a PCB having an edge-plated transistor well. In step 705, hole (200 of FIG. 2) is formed in a multi-layer PCB (100 of FIG. 2). In step 710, the multi-layer PCB (100 of FIG. 3) including hole (200 of FIG. 3) is plated with a conductor. In step 715, a portion of the plated conductor (305 of FIG. 4) is removed from the hole (200 of FIG. 4).

In step 720, multi-layer PCB (100 of FIG. 5) is joined to pallet (605 of FIG. 5) with an adhesive layer (610 of FIG. 5). In step 725, a layer of solder (530 in FIG. 5) is added to the top surface of the multi-layer PCB (100 in FIG. 5). Alternatively, steps 725 and 730 may be interchanged. Next, in steps 730, 735, and 740, the solder preform (505 in FIG. 5), the heat sink (520 of FIG. 5), and the component (510 of FIG. 5) are deposited in the hole (200 of FIG. 5) such that the solder preform (505 in FIG. 5) is positioned between the pallet (605 in FIG. 5) and the heat sink (520 in FIG. 5), and the heat sink (520 in FIG. 5) is positioned between the solder preform (505 in FIG. 5) and the body (515 in FIG. 5) of the component (510 in FIG. 5). The heat sink may be pre-attached to the component, or may be a separate piece used as a shim for a leadless component. For this embodiment an additional solder perform, or layer, would be added between the flangeless component and the heat sink.

In step (745 of FIG. 13), solder preform (505 of FIG. 5) and layer (530 of FIG. 5) are heated to a temperature above the melting point of solder. In some such embodiments, the entire assembly, including both multi-layer PCB (100 of FIG. 5) and pallet (605 of FIG. 5), are heated above the melting point of the solder used in solder preform (505 of FIG. 5) and layer (530 of FIG. 5). In step 750 of FIG. 13, solder preform (505 of FIG. 5) and layer (530 of FIG. 5), or alternatively the entire assembly, are cooled to a temperature below the melting point of solder.

Third Embodiment

FIG. 14 is an illustration of a multi-layer PCB 100 with a well 800 formed in the bottom. This embodiment tends to provide the advantage of leaving the circuit board layer 110 that will support the leads of an installed component (not shown), that will be soldered to circuitry in layer 105. A precision or close fit is more desirable where signal leads go into the component, than for the flange of the part where heat transfer, and perhaps grounding are accomplished. Thus, a smaller hole will be fabricated in layer 110 to bring the printed wiring traces closer to the component, and provide a better solder connection while a large opening of hole 800, will be left to accommodate the solder that will secure it. Bringing the board close to the part, or component, tends to reduce stray coupling from the part leads to other conductors. Also, providing one close tolerance fit, and a loose tolerance fit tends to prevent the accumulation of a tolerance and improve manufacturability of the printed wiring assembly.

The first step of this method is to form well 800 through the bottom of multi-layer PCB 100, including conductive planes 115, 125 and 135 and insulating planes 120 and 130, thereby exposing edges 805 of conductive plane 115 and edges 810 of conductive plane 125, respectively. An insulating plane 110 having a conducting plane 105 is disposed or laminated, such that well 800 is covered. A router may be used to cut a well 800 of a desired depth in a multi-layer PCB. In short, typical methods known to those skilled in the art may be used to form the well.

In an alternative embodiment of the multi-layer PCB 100, a hole may be disposed in one or more pre-assembled layers to form a first subassembly. A second subassembly formed from one or more layers may be bonded to the first subassembly covering the hole to form the well 800.

FIG. 15 illustrates the next step of this method, in which the second embodiment of the multi-layer PCB 100, including the walls of well 800, are plated with a conductor. Any convenient conductor may be used in this plating step. In some preferred embodiments, plating 905 is formed by depositing copper on the walls of well 800 according to techniques known to those of skill in the art. Plating 905 could be deposited in a range of thicknesses, but is generally formed with a thickness in the range of 0.001 to 0.005 inches. In one embodiment, plating 905 has an average thickness of approximately 0.003 inch.

FIG. 16 shows the second embodiment of the multi-layer PCB 100 having a hole 1000 formed through a portion of plating 905, through conductive plane 105 and through insulating plane 110, exposing edge 1005 of conductive plane 105.

FIG. 17 illustrates the second embodiment of the multi-layer PCB 100 attached to pallet 605 by adhesive material 610. Because pallet 605 acts as a heat sink and a ground, the pallet 605 should be composed of a conducting material which is sufficiently massive to have a relatively large heat capacity. Although the pallet 605 may be equivalently composed of a variety of conducting materials, in the present embodiment of the invention, the pallet 605 is formed of copper. In order to act as an effective heat sink, pallet 605 is often made thicker than conducting layers 105 to 135 and plating 905. In some embodiments, pallet 605 is in the range of 10 to 100 times thicker than the conducting layers or plating 905. In the exemplary embodiment, pallet 605 is formed of copper and is 0.157 inches thick.

Adhesive material 610 is as previously described, and may be made of any convenient adhesive, but is typically composed of an insulating material. In equivalent embodiments, adhesive material 610 is composed of resin-preimpregnated glass cloth. In further alternative embodiments, adhesive material 610 is composed of non-conductive epoxy or other similar adhesives. In the exemplary embodiment, adhesive material 610 is composed of "no-flow" resin-preimpregnated glass cloth, which is designed to retain its shape when heated above the melting point of solder and pressed in the laminating process. Pre-impregnated glass-cloth is advantageous in that it prevents the flow of solder into the space occupied by adhesive material 610, and adhesive material 610 tends not to flow into the space occupied by solder.

In the embodiment shown in FIG. 17, component 510 is a high-power RF transistor. Component 510 includes a body 515, which is typically formed of a ceramic or alumina material and supports a semiconductor die as previously described. Component 510 may also includes base or heat sink 520 that is typically plated with a conductor such as copper and may also have additional layers of plating, e.g., of gold or nickel. A separate heat sink used as a spacer may be used to compensate for a height differential between a multi-layer PCB and a component, either flanged or flangeless. Leads 525 connect component 510 to circuitry on conductive plane 105. In some alternative embodiments, conductive plane 105 includes an RF circuitry layer, and leads 525 connect component 510 to the RF circuitry layer such that increased support and improved signal transfer tend to be activated.

A solder preform 505 is disposed between the heat sink 520 and the pallet 605. In alternative embodiments, solder preform 505 is manufactured by punching a strip of solder alloy with a die of the desired shape or the solder preform 505 is stamped from laminated metal systems which include solder. Examples of metals used in such laminated metal systems include laminated copper-solder and solder-copper-solder. Alternative embodiments of solder preform 505 include flux as an integral part of solder preform 505 and some embodiments require a coating of flux to be applied to solder preform 505.

The solder preform 505 is typically flat and lies in the bottom of the well 800 and solder from solder preform 505 flows into voids 527 below the multi-layer PCB 100 after the assembly is heated.

Layer 530 attaches leads 525 of component 510 and forms an electrical contact with plating layer 905 at the top of multi-layer PCB 100. Equivalently, layer 530 is formed of a solder paste or layer 530 is formed of a conducting adhesive or similar material.

In the embodiment shown, layer 530 is applied to a portion of the top surface of the multi-layer PCB 100 before component 510 is disposed into hole 1000. The top of the multi-layer PCB 100 is typically masked with a silk screen or similar material, typically leaving only those portions exposed where layer 530 should be applied to provide a precise application of solder.

Next, the assembly is heated to a temperature slightly above the melting point of solder. The heating process melts preform 505 and the solder in layer 530, if any, resulting in the configuration shown in FIG. 18. When the assembly is cooled, component 1105 is securely joined to multi-layer PCB 100.

FIG. 19 is a flow diagram of the steps according to one method of fabricating the second embodiment of the present invention. In step 1005, well (800 of FIG. 14) is formed in a multi-layer PCB (100 of FIG. 14). In step 1010, the multi-layer PCB (100 of FIG. 14) including the well (800 of FIG. 14) is plated with a conductor (905 of FIG. 15). In step 1015, hole (1000 of FIG. 16) is formed through a portion of plated conductor (905 of FIG. 16) and on through the top of multi-layer PCB (100 of FIG. 16).

In step 1020, multi-layer PCB (100 of FIG. 17) is joined to pallet (605 of FIG. 17) with adhesive layer (610 of FIG. 17). In step 1025, a layer of solder (530 of FIG. 17) is added to the top surface of the multi-layer PCB (100 of FIG. 17). Alternatively, steps 1025 and 1030 may be interchanged. Next, in steps 1030, 1035, a solder preform (505 of FIG. 17), heat sink (520 of FIG. 17), and body (515 of FIG. 17) of the component (510 of FIG. 17) are inserted into the well (800 of FIG. 16) and hole (1000 of FIG. 16) such that the component (510 of FIG. 17) is on the top surface of the multi-layer PCB (100 of FIG. 17).

In step 1045, solder preform (505 of FIG. 17) and solder layer (530 of FIG. 17) are heated to a temperature above the melting point of solder, and, as shown in FIG. 18, the solder preform (505 of FIG. 17) flows into the voids (527 of FIG. 17) and between the walls of the well (800 of FIG. 16) and the heat sink (520 of FIG. 17). In some such embodiments, the entire assembly, including both multi-layer PCB (100 of FIG. 17) and pallet (605 of FIG. 17), are heated above the melting point of the solder used in solder preform (505 of FIG. 17) and layer (530 of FIG. 17). In step 1050 of FIG. 19, solder preform (505 of FIG. 18) and layer (530 of FIG. 18) are cooled to a temperature below the melting point of solder.

While the best mode for practicing the invention has been described in detail, those of skill in the art will recognize that there are numerous alternative designs, embodiments, modifications and applied examples which are within the scope of the present invention. Accordingly, the scope of this invention is not limited to the previously described embodiments.

What is claimed is:

1. A method of mounting a component to a multi-layer printed circuit board and a pallet, the multi-layer printed circuit board comprising a top circuitry layer, a bottom layer and a ground plane layer disposed between the top circuitry layer and the bottom layer, the method comprising:

forming a hole through the top circuitry layer, the ground plane layer and the bottom layer, thereby exposing a first edge of the top circuitry layer, a second edge of the ground plane layer and a third edge of the bottom layer;

plating a conductor inside the hole, thereby connecting the first edge, the second edge and the third edge with the conductor;

removing the plating from the first edge;

attaching the bottom layer to the pallet;

placing the component in the hole; and soldering the component to the top circuitry layer.

2. The method of claim 1, wherein the soldering step comprises:

disposing a pre-formed piece of solder between the component and the pallet; and heating the pre-formed piece of solder.

3. The method of claim 2, further comprises disposing a heat sink between the pre-formed piece of solder and the component before heating the pre-formed piece of solder.

4. The method of claim 1, wherein the soldering step comprises:

disposing a solder paste between the component and the top circuitry layer; and heating the solder paste.

5. The method of claim 1, wherein the attaching step comprises attaching the bottom layer to the pallet with an adhesive layer.

6. The method of claim 5, wherein the adhesive layer is of an electrically insulating material.

7. The method of claim 5, wherein the adhesive layer comprises an epoxy.

8. The method of claim 5, wherein the adhesive layer is a resin-preimpregnated glass cloth.

9. The method of claim 1, wherein the removing step comprises a routing of the plating from the first edge.

10. A method of mounting a component to a printed circuit board and a pallet, the printed circuit board comprising a top circuitry layer and a bottom layer, the method comprising:

forming a hole through the top circuitry layer and the bottom layer, thereby exposing a first edge of the top circuitry layer and a second edge of the bottom layer;

plating a conductor inside the hole, thereby connecting the first edge and the second edge with the conductor;

removing the plating from the first edge;

attaching the bottom layer to the pallet;

placing the component in the hole; and soldering the component to the top circuitry layer.

11. The method of claim 10, wherein the soldering step comprises:

disposing a pre-formed piece of solder between the component and the pallet; and heating the pre-formed piece of solder.

12. The method of claim 11, further comprises disposing a heat sink between the pre-formed piece of solder and the component before heating the pre-formed piece of solder.

13. The method of claim 11, wherein the soldering step further comprises:

disposing a solder paste between the component and the top circuitry layer; and heating the solder paste.

14. The method of claim 10, wherein the attaching step comprises attaching the bottom layer to the pallet with an adhesive layer.

15. The method of claim 14, wherein the adhesive layer is an insulating layer.

16. The method of claim 14, wherein the adhesive layer is an epoxy.

17. The method of claim 14, wherein the adhesive layer is a layer of resin-preimpregnated glass cloth.

18. The method of claim 10, wherein the removing step comprises the step of routing the plating from the first edge.

19. A method of mounting a component to a printed circuit board (PCB) and a pallet forming a PCB assembly, the printed circuit board including a top circuitry layer and a bottom layer, the method comprising:
   forming a hole through the top circuitry layer and the bottom layer;
   attaching the bottom layer to the pallet; and
   soldering the component to the top circuitry layers comprising:
      disposing a first solder paste area between a lead mounting area of the component and the top circuitry layer;
      disposing a second solder paste area between a flange of the component and the pallet; and
      heating the PCB assembly in a reflow operation.

20. The method of claim 19, wherein the heating step is an IR reflow operation.

21. The method of claim 19, wherein the attaching step comprises attaching the bottom layer of the PCB to the pallet with an adhesive layer.

22. The method of claim 21, wherein the adhesive layer is an electrically insulating material.

23. The method of claim 21, wherein the adhesive layer is an epoxy.

24. The method of claim 21, wherein the adhesive layer is a sheet of resin-preimpregnated glass cloth.

25. A method of mounting a component to a multi-layer printed circuit board and a pallet to form a printed wiring board assembly (PWB assembly), the multi-layer printed circuit board (PCB) comprising a top circuitry layer, a bottom circuitry layer and a ground plane circuitry layer disposed between the top circuitry layer and the bottom circuitry layer each layer separated by a dielectric material, the method comprising:
   forming a hole in the PCB extending through the top circuitry layer, the ground plane circuitry layer and the bottom circuitry layer of the PCB, thereby exposing a first edge of the top circuitry layer, a second edge of the ground plane circuitry layer and a third edge of the bottom circuitry layer;
   plating a conductor inside the hole, thereby coupling the first edge, the second edge and the third edge with the conductor;
   removing the plating from the first edge;
   attaching the multi-layer printed circuit board to the pallet by disposing an adhesive layer between the bottom circuitry layer of the PCB and the pallet such that the pallet covers the hole in the PCB;
   placing a piece of pre-formed solder inside the hole such that the piece of pre-formed solder makes contact with the pallet;
   inserting a portion of the component that is to be coupled to the pallet into the hole; and
   heating the multi-layer printed circuit board and the attached pallet.

26. A method of mounting a component to a multi-layer printed circuit board (PCB) and a pallet that forms a PCB assembly, the multi-layer printed circuit board comprising a top circuitry layer, a bottom layer and a ground plane layer disposed between the top circuitry layer and the bottom layer, the method comprising:
   forming a well extending through the bottom layer and the ground plane layer, thereby exposing a first edge of the bottom layer and a second edge of the ground plane layer;
   plating a conductor inside the well, thereby coupling the first edge end the second edge with the conductor;
   forming a hole through a portion of the conductor that forms a bottom of the well and through the top circuitry layer, thereby exposing a third edge of the top circuitry layer and thereby forming a hole through the PCB in which the ground layer and bottom layer are coupled with the conductor, and the top layer is not coupled to the conductor;
   attaching the bottom layer to a pallet in which the pallet covers the hole;
   inserting a piece of pre-formed solder through the hole into the well such that the piece of pre-formed solder makes contact with the pallet;
   placing a component inside the hole; and
   heating the multi-layer printed circuit board and the pallet.

27. The method of claim 26, wherein the component is an RF power transistor.

28. The method of claim 27, wherein the RF power transistor includes a flange.

29. The method of claim 27, wherein the RF power transistor is flangeless.

30. The method of claim 26, wherein the component is an attenuator.

31. The method of claim 30, wherein the attenuator includes a flange.

32. The method of claim 26, wherein the conductor is deposited in the well by a plating process.

33. The method of claim 26, wherein the multi-layer printed circuit board is a multi-layer laminated printed circuit board.

34. A method of fabricating a printed circuit board assembly comprising:
   forming a well, having a well side surface and a well bottom, in a printed circuit board (PCB), the PCB having a first surface and an opposing second surface, the well being formed on a side of the first surface;
   depositing a conductive material in the well resulting in a conductive well side surface coupled to a conductive well bottom and electrically coupled to the first surface of the printed circuit board;
   forming a hole through the printed circuit board such that a portion of the well bottom is removed;
   coupling a heat sink to the first surface of the printed circuit board;
   disposing a solder material in the well;
   disposing a component in the well such that the solder material is between the component and the heat sink; and
   heating the assembly to melt the solder material.

35. The method of claim 34, wherein the solder material is solder paste.

36. The method of claim 34, wherein the solder material is conductive epoxy.

37. The method of claim 34, wherein the heat sink is coupled to the first side of the printed circuit board by bonding with a non-conductive adhesive.

* * * * *